(12) United States Patent
Choi et al.

(10) Patent No.: US 10,355,099 B2
(45) Date of Patent: Jul. 16, 2019

(54) SEMICONDUCTOR DEVICE

(71) Applicant: Samsung Electronics Co., Ltd., Suwon-si, Gyeonggi-do (KR)

(72) Inventors: Eun Yeoung Choi, Hwaseong-si (KR); Jun Kyu Yang, Seoul (KR); Young Jin Noh, Suwon-si (KR); Jae Young Ahn, Seongnam-si (KR); Jae Hyun Yang, Suwon-si (KR); Dong Chul Yoo, Seongnam-si (KR); Jae Ho Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/871,055

(22) Filed: Jan. 14, 2018

(65) Prior Publication Data

US 2018/0366554 A1 Dec. 20, 2018

(30) Foreign Application Priority Data

Jun. 19, 2017 (KR) .................. 10-2017-0077268

(51) Int. Cl.
| | |
|---|---|
| *H01L 29/51* | (2006.01) |
| *H01L 27/11565* | (2017.01) |
| *H01L 27/11582* | (2017.01) |
| *H01L 27/1157* | (2017.01) |

(52) U.S. Cl.
CPC ........ *H01L 29/513* (2013.01); *H01L 27/1157* (2013.01); *H01L 27/11565* (2013.01); *H01L 27/11582* (2013.01)

(58) Field of Classification Search
CPC ......... H01L 27/11565; H01L 27/11582; H01L 29/513
See application file for complete search history.

(56) References Cited

U.S. PATENT DOCUMENTS

| | | |
|---|---|---|
| 7,042,054 B1 | 5/2006 | Ramkumar et al. |
| 7,550,347 B2 | 6/2009 | Choi et al. |
| 8,093,124 B2 | 1/2012 | Lee et al. |
| (Continued) | | |

FOREIGN PATENT DOCUMENTS

| | | |
|---|---|---|
| KR | 101018710 B1 | 3/2011 |
| KR | 20110118961 A | 11/2011 |

OTHER PUBLICATIONS

Park, Jong Kyung et al., "Lanthanum-Oxide-Doped Nitride Charge-Trap Layer for a TANOS Memory Device", IEEE Transactions on Electron Devices, V. 58, No. 10, Oct. 2011, pp. 3314-3320.

*Primary Examiner* — Allan R Wilson
(74) *Attorney, Agent, or Firm* — Renaissance IP Law Group LLP

(57) ABSTRACT

A plurality of gate electrodes is stacked on an upper surface of a substrate in a direction perpendicular to an upper surface of the substrate. A channel region penetrates through the plurality of gate electrodes to extend perpendicularly to the upper surface of the substrate. A gate dielectric layer includes a tunneling layer, a charge storage layer and a blocking layer that are sequentially disposed between the channel region and the plurality of gate electrodes. The charge storage layer includes a plurality of doping elements and a plurality of deep level traps generated by the plurality of doping element. A concentration distribution of the plurality of doping elements in a thickness direction of the charge storage layer is non-uniform.

17 Claims, 21 Drawing Sheets

(56) References Cited

U.S. PATENT DOCUMENTS

| | | |
|---|---|---|
| 8,236,647 B2 | 8/2012 | Lee et al. |
| 9,246,015 B2 | 1/2016 | Hsu et al. |
| 9,356,031 B2 | 5/2016 | Lee et al. |
| 9,368,510 B1 | 6/2016 | Rabkin et al. |
| 2008/0087944 A1 | 4/2008 | Shin et al. |
| 2011/0303969 A1* | 12/2011 | Kai .................. H01L 27/11578 257/324 |
| 2012/0139027 A1* | 6/2012 | Son .................... H01L 29/7926 257/324 |
| 2013/0062684 A1 | 3/2013 | Ding et al. |
| 2014/0286098 A1* | 9/2014 | Yasuda .............. H01L 27/1157 365/185.11 |
| 2015/0194440 A1 | 7/2015 | Noh et al. |
| 2017/0069654 A1* | 3/2017 | Matsuo ............ H01L 27/11582 |

* cited by examiner

SEMICONDUCTOR DEVICE

CROSS-REFERENCE TO RELATED APPLICATION

This application claims priority under 35 U.S.C. § 119 to Korean Patent Application No. 10-2017-0077268 filed on Jun. 19, 2017 in the Korean Intellectual Property Office, the disclosure of which is incorporated herein by reference in its entirety.

TECHNICAL FIELD

The present inventive concept relates to a semiconductor device.

DISCUSSION OF RELATED ART

While semiconductor devices are required to process high capacity data, the volumes thereof have gradually been reduced, which demands higher integration of semiconductor elements constituting such semiconductor devices. A semiconductor device having a charge storage layer trapping a charge has been proposed.

SUMMARY

According to an exemplary embodiment of the present inventive concept, semiconductor device is provided as follows. A plurality of gate electrodes are stacked on an upper surface of a substrate in a direction perpendicular to an upper surface of the substrate. A channel region penetrates through the plurality of gate electrodes to extend perpendicularly to the upper surface of the substrate. A gate dielectric layer includes a tunneling layer, a charge storage layer, and a blocking layer that are sequentially disposed between the channel region and the plurality of gate electrodes. The charge storage layer includes a plurality of doping elements and a plurality of deep level traps generated by the plurality of doping element. Concentration distribution of the plurality of doping elements in a thickness direction of the charge storage layer is non-uniform.

According to an exemplary embodiment of the present inventive concept, a semiconductor device is provided as follows. A plurality of gate electrodes are stacked on a substrate in a direction perpendicular to an upper surface of the substrate. A channel region penetrates through the plurality of gate electrodes to extend perpendicularly to the upper surface of the substrate. A gate dielectric layer includes a tunneling layer, a charge storage layer, and a blocking layer that are sequentially disposed between the channel region and the plurality of gate electrodes. The charge storage layer includes silicon nitride doped with a plurality of doping elements including at least one of C, B, La, Hf, Zr, Al, and Y.

According to an exemplary embodiment of the present inventive concept, a semiconductor device is provided as follows. A gate electrode is disposed on a channel region. A gate dielectric layer includes a tunneling layer, a charge storage layer, and a blocking layer that are sequentially disposed between the channel region and the gate electrode. The charge storage layer includes a plurality of doping elements forming a plurality of deep level traps. The plurality of doping elements are at least one of C, B, La, Hf, Zr, Al, and Y.

BRIEF DESCRIPTION OF DRAWINGS

These and other features of the present inventive concept will become more apparent by describing in detail exemplary embodiments thereof with reference to the accompanying drawings of which.

DETAILED DESCRIPTION OF EXAMPLE EMBODIMENTS

Hereinafter, example embodiments of the present inventive concept will be described with reference to the accompanying drawings.

Figure 1:
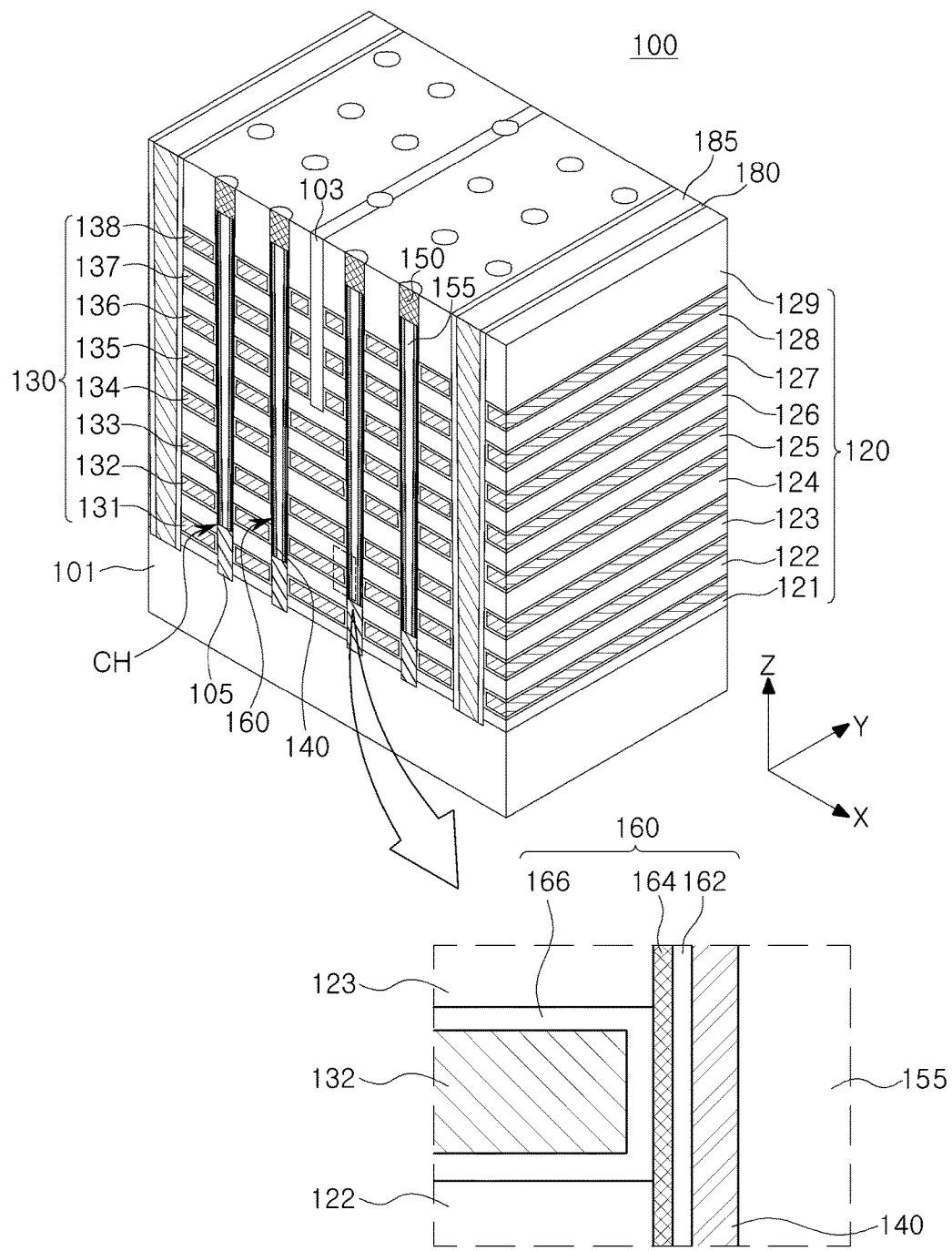
FIG. 1 is a schematic perspective view of a semiconductor device according to example embodiments.

FIG. 1 is a schematic perspective view of a semiconductor device according to example embodiments.

With reference to FIG. 1, a semiconductor device 100 may include a substrate 101, a plurality of channels CH extending in a direction perpendicular to an upper surface of the substrate 101, a plurality of interlayer insulating layers 120 and a plurality of gate electrodes 130 stacked along outer sidewalls of the channels CH. Each of the channels CH may include a channel region 140. The semiconductor device 100 may further include a plurality of gate dielectric layers 160. The channel region 140 may be interposed between one of the gate dielectric layers 160 and the gate electrodes 130. The semiconductor device 100 may further include a plurality of epitaxial layers 105 each of which is disposed below the channel region 140, a plurality of channel pads 150 on upper ends of the channels CH, and a source conductive layer 185 between the gate electrodes 130. In FIG. 1, a wiring structure on an upper portion of the semiconductor device 100, for example, some components such as bit lines, are omitted.

In the semiconductor device 100, each of a plurality of memory cell strings may be configured on the channel region 140. The memory cell strings may be arranged in rows and columns in X and Y directions.

The substrate 101 may have an upper surface extended in X and Y directions. The substrate 101 may include a semiconductor material, for example, a group IV semiconductor material, a group III-V compound semiconductor material, or a group II-VI oxide semiconductor material. For example, an example of the group IV semiconductor material may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The channels CH may be spaced apart from each other in rows and columns on the substrate 101. The channels CH may be arranged in a lattice form or in a zigzag form in one direction. The channels CH may have an inclined side in such a manner that widths of the channels CH are reduced toward the substrate 101. The channel region 140 may be disposed in each of the channels CH. The channel region 140 in the channels CH may have an annular shape surrounding a channel insulating layer 155 provided therein, but the channel region 140 may also have a columnar shape, such as a cylindrical or prismatic shape, without the channel insulating layer 155 therein, according to an example embodiment. The channel region 140 may be connected to one of the epitaxial layers 105 provided therebelow. The channel region 140 may include a semiconductor material such as polycrystalline silicon or single crystalline silicon. The semiconductor material may be an undoped material or a material including p-type or n-type impurities. The channels CH arranged in the X direction may be connected to different bit lines according to an arrangement of upper wiring structures connected to the channel pads 150. Also, portions of the channels CH may be dummy channels that are not connected to the bit lines.

The gate electrodes 130 may be spaced apart from each other along sides of the channels CH in a direction perpendicular to an upper surface of the substrate 101. For example, the gate electrodes 130 (indicated as 131 to 138) may include eight gate electrodes. The lowermost one of the eight gate electrodes may be referred to a lowermost gate electrode 131, and a gate electrode immediately above the lowermost gate electrode 131 may be referred to a second gate electrode 132. The eight gate electrodes are stacked vertically on the upper surface of the substrate 101. The direction perpendicular to the upper surface of the substrate 101, which is parallel to a Z direction, may be referred to as "vertically" or "in a vertical direction." The gate electrodes 130 may form a gate of a ground selection transistor, gates of a plurality of memory cells, and a gate of a string selection transistor, respectively. The gate electrodes 130 may extend to form a plurality of word lines, a string select line and a ground select line. The word lines may be commonly connected to a predetermined group of memory cell strings adjacent to each other and arranged in a X direction and a Y direction. The gate electrodes 130 forming the string select line may be separated from each other in the X direction by a string insulating layer 103, but the number of the gate electrodes 130 separated by the string insulating layer 103 is not limited to that illustrated in the drawing.

According to an example embodiment, the gate electrodes 130 of the string selection transistor and the ground selection transistor may be one or more gate electrodes, and may have a structure that is the same as or different from those of the gate electrodes 130 of the memory cells MC. A portion of the gate electrodes 130, for example, gate electrodes 130 adjacent to the gate electrodes 130 of the ground selection transistor or the string selection transistor, may be dummy gate electrodes.

The gate electrodes 130 may include a metal, for example, tungsten (W). According to an example embodiment, the gate electrodes 130 may include polycrystalline silicon or a metal silicide material. In example embodiments, the gate electrodes 130 may further include a diffusion barrier.

The interlayer insulating layers 120 may be arranged between the gate electrodes 130. For example, the interlayer insulating layers 120 include nine interlayer insulating layers that are vertically stacked on the upper surface of the substrate 101. The interlayer insulating layers 120 may also be arranged to be spaced apart from each other in the Z direction and to extend in the Y direction, in a manner similar to the case of the gate electrodes 130. The interlayer insulating layers 120 may include an insulating material such as silicon oxide or silicon nitride.

The gate dielectric layers 160 may be disposed between the gate electrodes 130 and the channel region 140. Each of the gate dielectric layers 160 may include a tunneling layer 162, a charge storage layer 164, and a blocking layer 166 sequentially stacked from the channel region 140. The tunneling layer 162 and the charge storage layer 164 may vertically extend from the upper surface of the substrate 101 in a manner similar to the channel region 140, and the blocking layer 166 may be disposed to surround the gate electrodes 130.

The tunneling layer 162 may allow for tunneling of a charge to be transmitted to the charge storage layer 164 via F—N tunneling mechanism. The tunneling layer 162 may include, for example, silicon dioxide ($SiO_2$), silicon nitride ($Si_3N_4$), silicon oxynitride (SiON), or combinations thereof. The blocking layer 166 may include silicon dioxide ($SiO_2$), silicon nitride ($Si_3N_4$), silicon oxynitride (SiON), a high-k dielectric material, or combinations thereof. In this case, the high-k dielectric material refers to a dielectric material having a dielectric constant higher than that of silicon dioxide ($SiO_2$).

The charge storage layer 164 may be a charge trapping layer that may be formed of silicon nitride. The charge storage layer 164 may include doping elements forming deep-level traps in the charge storage layer 164. The doping elements may be diffused from an impurity providing layer formed to be in contact with the charge storage layer 164, which will be described in further detail with reference to FIGS. 7A to 7I. The doping elements may be, for example, carbon (C), boron (B), lanthanum (La), hafnium (Hf), zirconium (Zr), aluminum (Al) or yttrium (Y). For example, when the charge storage layer 164 is formed of silicon nitride, the doping elements may be bonded with nitrogen (N) of the charge storage layer 164. In other words, the doping elements may be chemically bonded with nitrogen of the charge storage layer 164. The charge storage layer 164 may also further include oxygen (O) diffused together with the doping elements. The doping elements may be non-uniformly distributed in the charge storage layer 164 in a thickness direction of the charge storage layer 164, which will be described in more detail below with reference to FIGS. 3 to 4C.

The epitaxial layers 105 may be disposed on lower ends of the channels CH while being disposed on the substrate 101 and being disposed on a side of the at least one gate electrode of the gate electrodes 130. The epitaxial layers 105 may be disposed in recessed regions of the substrate 101. Upper surfaces of the epitaxial layers 105 may be higher than an upper surface of the lowermost gate electrode 131 and may be lower than a lower surface of the second gate electrode 132, but is not limited thereto. Thus, even when an aspect ratio of each of the channels CH is increased, the channel region 140 may be electrically connected to the substrate 101 by the epitaxial layer 105, and characteristics of the ground selection transistor formed using the lowermost gate electrode 131, for example, between memory cell strings may be uniform. However, in example embodiments, the epitaxial layer 105 may be omitted, and in this case, the channel region 140 may be directly connected to the substrate 101.

Each of the channel pads 150 may be disposed on an upper portion of the channel region 140 in the channels CH. Each of the channel pads 150 may be disposed to cover an upper surface of the channel insulating layer 155 and to be electrically connected to the channel region 140. The channel pads 150 may include, for example, doped polycrystalline silicon.

The source conductive layer 185 may penetrate through the gate electrodes 130 and the interlayer insulating layers 120 between the channel regions 140, to be connected to the substrate 101, and may be electrically insulated from the gate electrodes 130 by a source insulating layer 180. Thus, the gate electrodes 130 may be separated from each other with the source conductive layer 185 interposed therebetween in an X direction. The source conductive layer 185 may have a linear shape extending in the Y direction, and may correspond to a common source line. The source conductive layer 185 may be in plural and arranged at a predetermined interval in the X direction, for example. For example, the source conductive layer 185 in plural may be arranged every four to five columns of the channel regions 140, but the present inventive concept is not limited thereto. The source conductive layer 185 may have a form in which a width of the source conductive layer is reduced toward the substrate 101.

Figure 2A:
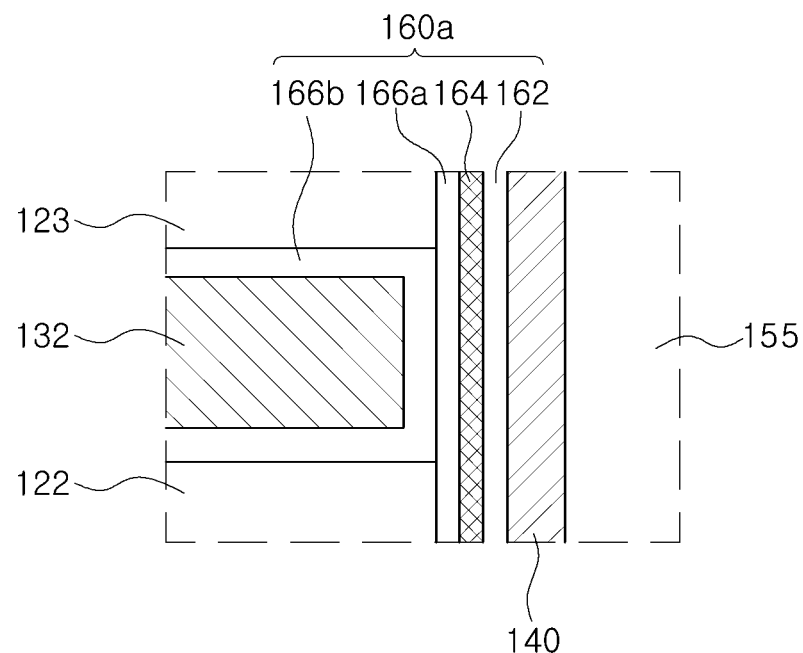
FIGS. 2A and 2B are cross-sectional views illustrating gate dielectric layers according to example embodiments, as regions corresponding to an enlarged region of FIG. 1.
Figure 2B:
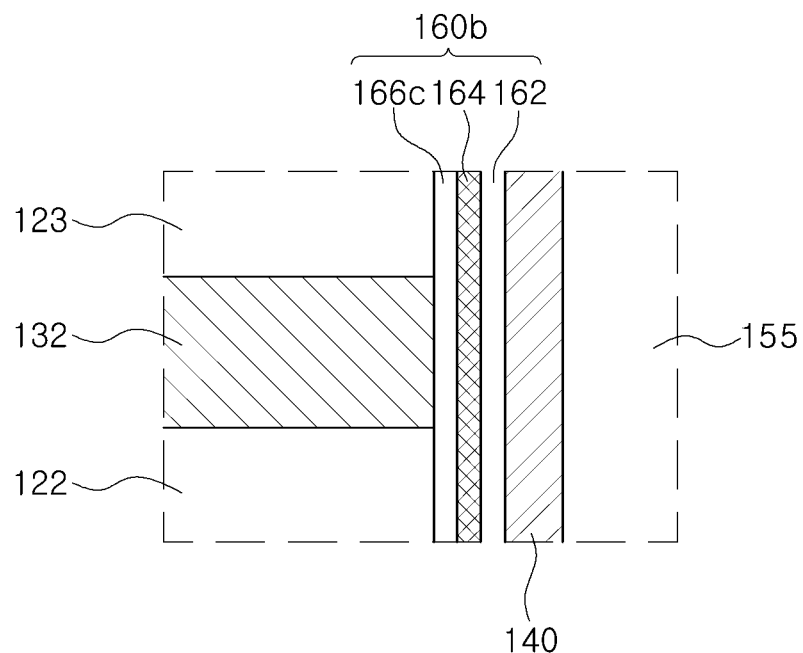

FIGS. 2A and 2B are cross-sectional views illustrating gate dielectric layers according to example embodiments, as regions corresponding to an enlarged region of FIG. 1. The description of the gate dielectric layers 160 may be made with respect to the second gate electrode 132 for the convenience of description.

Referring to FIG. 2A, the second gate electrode 132, a gate dielectric layer 160a, and a channel region 140 of memory cell strings are illustrated. The gate dielectric layer 160a may have a stack structure in which a tunneling layer 162, a charge storage layer 164, and a first blocking layer 166a and a second blocking layer 166b are sequentially stacked from the channel region 140. Relative thicknesses of the layers constituting the gate dielectric layer 160a are not limited to the thicknesses illustrated in the drawings, and may be variously modified according to example embodiments.

In the case of the gate dielectric layer 160a according to the example embodiment, in a manner different from the example embodiment of FIG. 1, the blocking layer may include two layers—the first blocking layer 166a and the second blocking layer 166b, which may serve as the blocking layer 166 of FIG. 1. The first blocking layer 166a may vertically extend from the upper surface of the substrate 101 like the channel region 140, and the second blocking layer 166b may be disposed to surround the second gate electrode 132. For example, the first blocking layer 166a may be a layer having a relatively lower dielectric constant, and the second blocking layer 166b may be a layer having a relatively higher dielectric constant. In this case, as the first blocking layer 166a is disposed on a side surface of the second blocking layer 166b, an energy band such as a barrier height may be controlled to improve semiconductor device characteristics, for example, erase characteristics. For example, the first blocking layer 166a may include silicon dioxide ($SiO_2$). The second blocking layer 166b may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), praseodymium oxide ($Pr_2O_3$), or combinations thereof.

Referring to FIG. 2B, the second gate electrode 132, a gate dielectric layer 160b, and a channel region 140 of memory cell strings are illustrated. The gate dielectric layer 160b may have a stack structure in which a tunneling layer 162, a charge storage layer 164, and a blocking layer 166c are sequentially stacked from the channel region 140. For example, in the case of the gate dielectric layer 160b according to the example embodiment, in a manner different from the example embodiments of FIGS. 1 and 2A, all of the tunneling layer 162, the charge storage layer 164, and the blocking layer 166c may extend vertically from the upper surface of the substrate 101 like the channel region 140.

In example embodiments, the arrangement of the layers forming the gate dielectric layers 160, 160a and 160b may be variously modified as described above, and each of the tunneling layer 162, the charge storage layer 164, and the blocking layer 166c may also be composed of a plurality of layers.

Figure 3:
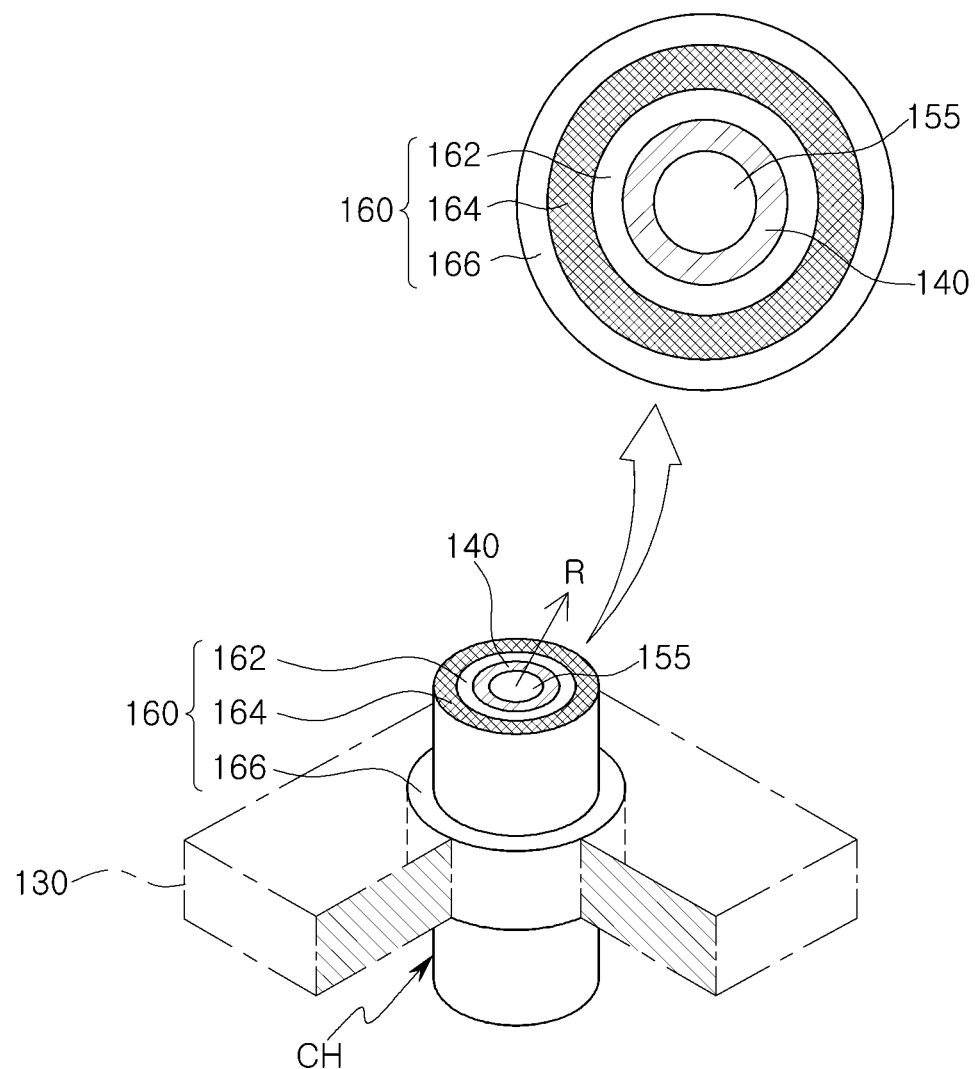
FIG. 3 is a partially cutaway perspective view illustrating a channel according to example embodiments.
Figure 4A:
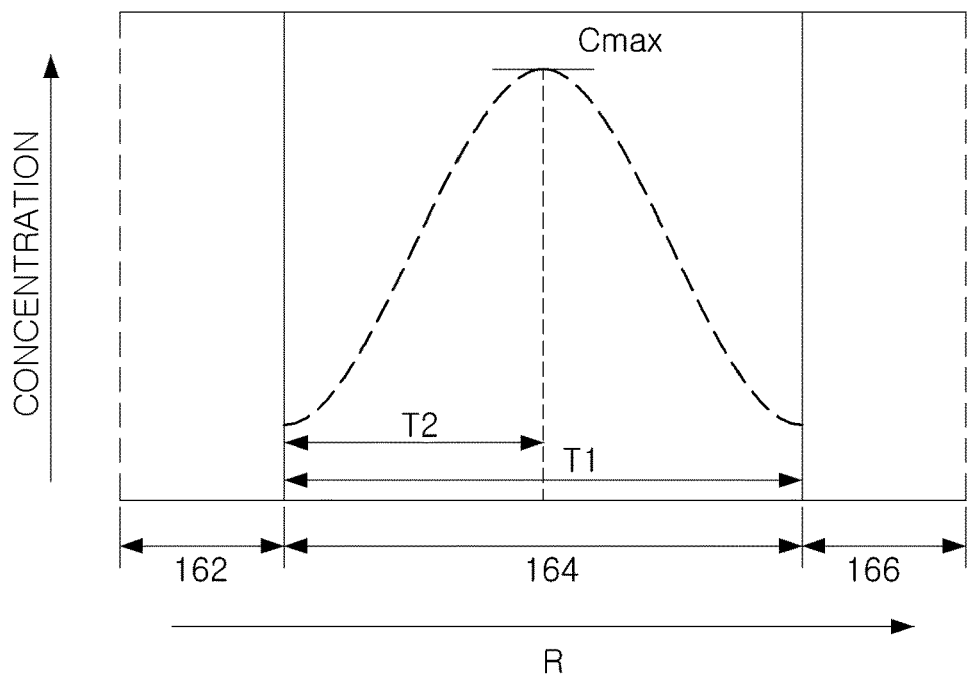
FIGS. 4A to 4C are graphs illustrating a concentration distribution of doping elements in a charge storage layer according to example embodiments.
Figure 4B:
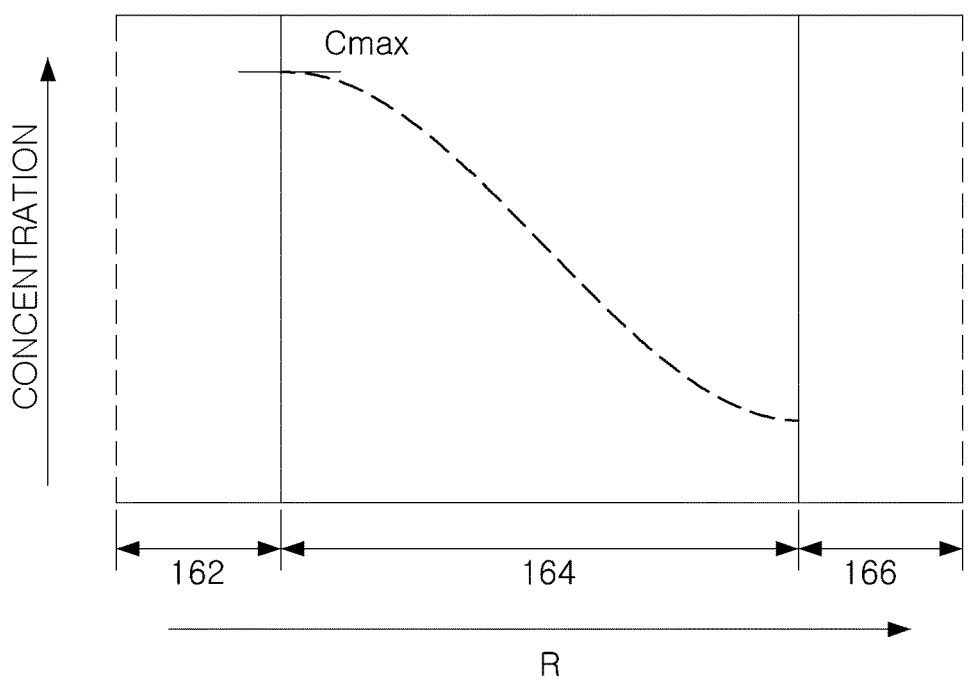
Figure 4C:
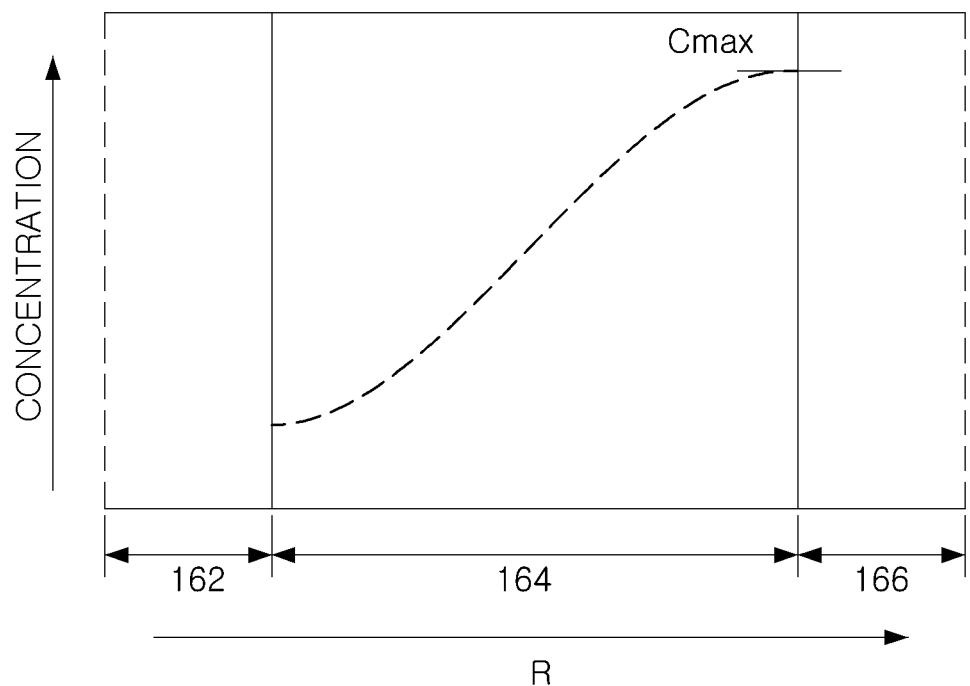

FIG. 3 is a partially cutaway perspective view illustrating a channel according to example embodiments. In FIG. 3, one of the channels CH in FIG. 1 is illustrated as being enlarged. FIGS. 4A to 4C are graphs illustrating a concentration distribution of doping elements in a charge storage layer according to example embodiments.

Referring to FIG. 3, the channel CH may have a columnar shape, and may have a circular or elliptical cross-section on a plane. In the channel CH, the channel insulating layer 155, the channel region 140, and a portion of the gate dielectric layer 160 may be sequentially disposed from a center of the channel CH in an R direction, for example, in a thickness direction of the channel. In this specification, the 'thickness direction' refers to a direction in which the layers are stacked, in detail, a direction from the center of a circle forming a cross section of the channel CH to an outer circumferential surface of the channel CH, for example, the R direction in FIG. 3.

The charge storage layer 164 of the gate dielectric layer 160 may include doping elements forming deep-level traps. The doping elements may be non-uniformly distributed within the charge storage layer 164 in the R direction. For example, the doping elements may not have a constant concentration in the charge storage layer 164 in the R direction.

Referring to FIG. 4A, concentration of the doping elements in the charge storage layer 164 may increase and then decrease again in the R direction. In the case of the charge storage layer 164, a position thereof having a maximum concentration Cmax of the doping elements may be a position corresponding to a center portion of the charge storage layer 164, from which the concentration of the doping elements may decrease in a direction toward both edges of the charge storage layer 164, in the R direction. The concentration of the doping elements may have a normal distribution centering on the center portion of the charge storage layer 164, but is not limited thereto. For example, when a thickness of the charge storage layer 164 is a first thickness T1, the center portion of the charge storage layer 164 may correspond to a point having a second thickness T2, for example, a point at which a thickness corresponds to half of the first thickness T1 in the R direction. For example, when the charge storage layer 164 is formed of silicon nitride, the maximum concentration Cmax of the doping elements may be about 10 atomic percentage (at. %) of a nitrogen (N) concentration of the charge storage layer 164 or less, for example, within a range of 2 at. % to 7 at. %. For example, when the maximum concentration Cmax is relatively low, deep levels may not be sufficiently formed, and charge loss characteristics may not be improved. When the maximum concentration Cmax is relatively high, erasing efficiency may be relatively lowered. This will be described in more detail below with reference to FIG. 5.

Referring to FIGS. 4B and 4C, the concentration of the doping elements in the charge storage layer 164 may be highest at one edge thereof and may decrease toward the other edge thereof in the R direction. In an example embodiment of FIG. 4B, concentration of the doping elements in the charge storage layer 164 may decrease in the R direction, such that the doping elements has a maximum concentration (Cmax) in a region of the charge storage layer 164 adjacent to the tunneling layer 162 and a minimum concentration in a region thereof adjacent to the blocking layer 166. Alternatively, in an example embodiment of FIG. 4C, on the other hand, concentration of the doping elements in the charge storage layer 164 may gradually increase from a region adjacent to the tunneling layer 162 toward the blocking layer 166 and then may have a maximum concentration (Cmax) in a region adjacent to the blocking layer 166. In the case of the example embodiments of FIGS. 4B and 4C, the maximum concentration Cmax may be about 10 at. % or less of a nitrogen (N) concentration of the charge storage layer 164, for example, within a range of 2 at. % to 7 at. %.

Figure 5:
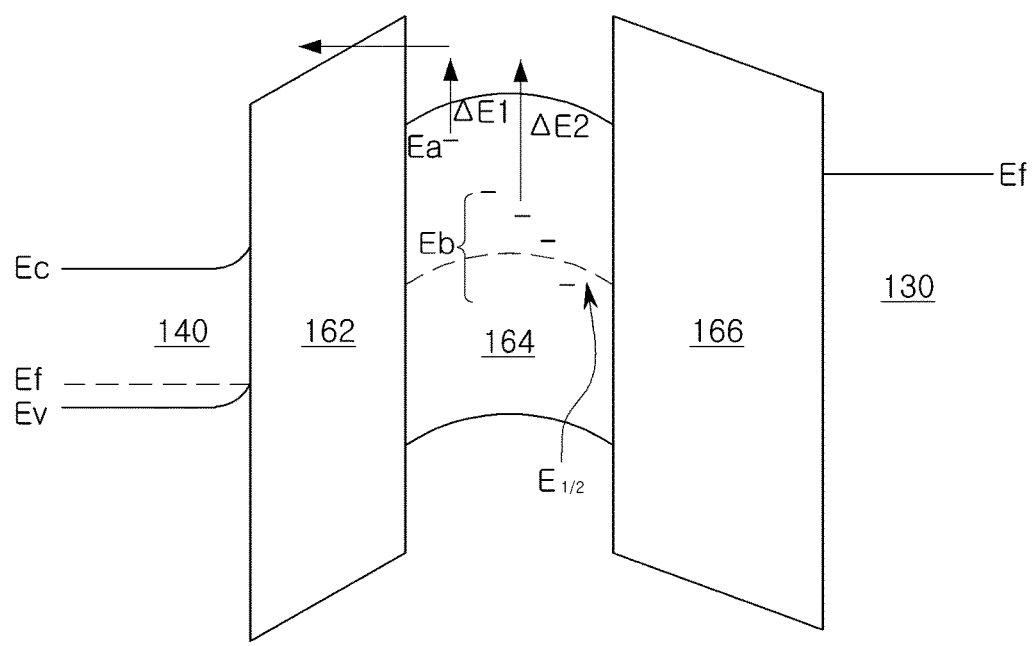
FIG. 5 is a band diagram illustrating charge storage characteristics in a memory cell according to example embodiments.

FIG. 5 is a band diagram illustrating charge storage characteristics in a memory cell according to example embodiments.

Referring to FIG. 5, energy bands of the channel region 140, the tunneling layer 162, the charge storage layer 164, the blocking layer 166, and the gate electrode 130 are illustrated from the left side of the drawing. The example embodiment illustrates retention states, in a specific case in which the blocking layer 166 is formed of a high-k dielectric material and the charge storage layer 164 is formed of a silicon nitride, by way of example. However, thicknesses of respective regions and band offsets between regions are provided by way of examples, and thus, may be modified according to thicknesses and materials in respective example embodiments.

The charge storage layer 164 may have various trap levels, and in the case of a shallow-level trap Ea, the shallow-level trap may be located relatively close to a conduction band Ec in comparison with deep-level traps Eb thereto. The deep-level traps Eb may be traps located relatively close to an intermediate energy level $E_{1/2}$ between a valence band Ev and the conduction band Ec. The deep-level traps Eb may be located, for example, at energy levels within a range corresponding to one-half of band gap energy, centered on the intermediate energy level $E_{1/2}$. For example, the deep-level traps Eb may be located at a depth of about 1.5 to 3.5 eV from the conduction band Ec, and may be formed relatively widely toward the conduction band Ec from the intermediate energy level $E_{1/2}$, but are not limited thereto. In the case of the shallow-level trap Ea, energy $\Delta E1$ required to remove trapped charge may be relatively low, and thus, electric charge may be easily moved to the tunneling layer 162 or the blocking layer 166. On the other hand, in the case of the deep-level traps Eb, in order to remove charge from trap sites, a relatively great amount of energy $\Delta E2$ may be required. Thus, for example, when a relatively large amount of deep-level traps Eb are provided in the charge storage layer 164, program charge loss may be prevented, and retention characteristics may be improved.

Figure 6A:
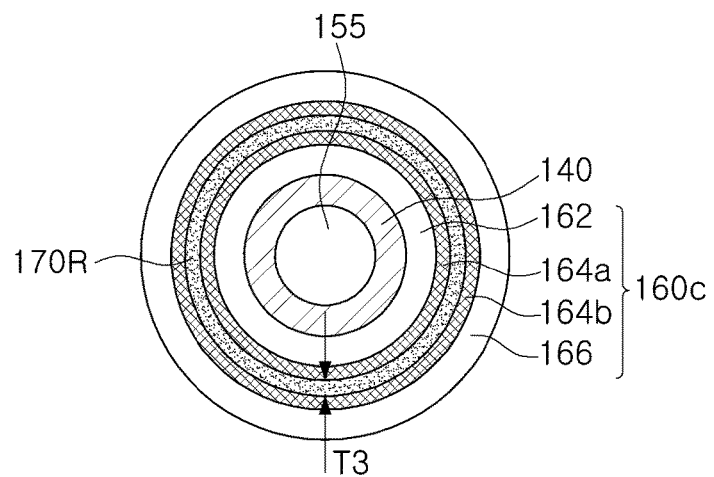
FIGS. 6A to 6C are cross-sectional views illustrating structures of a gate dielectric layer of a semiconductor device according to example embodiments.
Figure 6B:
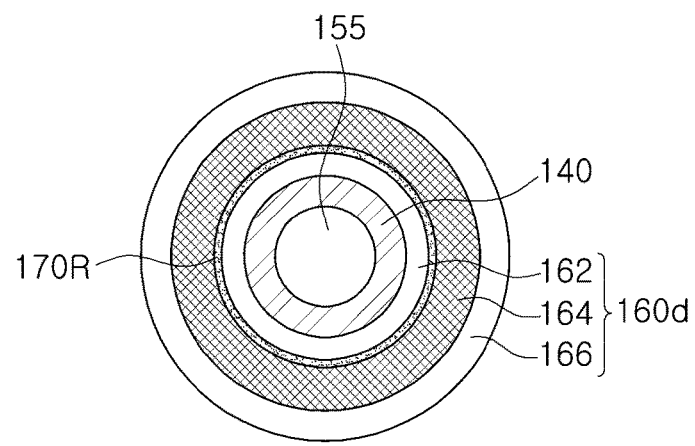
Figure 6C:
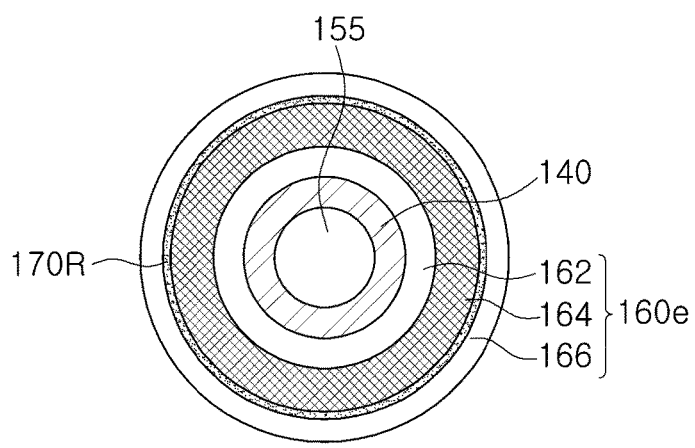

FIGS. 6A to 6C are cross-sectional views illustrating structures of a gate dielectric layer of a semiconductor device according to example embodiments. FIGS. 6A to 6C illustrate regions corresponding to those in the enlarged view of FIG. 3.

Referring to FIG. 6A, a gate dielectric layer 160c may include a tunneling layer 162, a charge storage layer 164, and a blocking layer 166. The charge storage layer 164 may include a first layer 164a and a second layer 164b spaced apart from each other, and an impurity providing layer 170R may be disposed between the first layer 164a and the second layer 164b.

The impurity providing layer 170R may be a layer to provide doping elements to the first layer 164a and the second layer 164b. For example, the impurity providing layer 170R may be a layer remaining after a material including doping elements is diffused into the first layer 164a and the second layer 164b. The impurity providing layer 170R may be disposed in a central portion of the charge storage layer 164 in a thickness direction, for example, between the first layer 164a and the second layer 164b of the charge storage layer 164, and doping elements from the impurity providing layer 170R may be diffused such that the first layer 164a and the second layer 164b are doped therewith. Thus, concentration of the doping elements in the first layer 164a and the second layer 164b is highest in a region in contact with the impurity providing layer 170R, and may have the same as or similar distribution to that in FIG. 4A.

The impurity providing layer 170R may be one layer including at least one of SiCN, SiBN, LaO, HfO, ZrO, AlO, or YO. For example, when the impurity providing layer 170R is a SiCN layer and the first layer 164a and the second layer 164b are silicon nitride layers, the impurity providing layer 170R provides carbon (C) to the first layer 164a and the second layer 164b. When the impurity providing layer 170R is formed of a high-k material, such as LaO, HfO, ZrO, AlO or YO, the impurity providing layer 170R provides a metal element forming the high-k material, to the first layer 164a and the second layer 164b. In addition, in this case, oxygen forming the high-k material may also be diffused and provided to the first layer 164a and the second layer 164b, together with the metal element. In example embodiments, the high-k material constituting the impurity providing layer 170R may have a non-stoichiometric composition other than a commonly used stoichiometric composition. For example, the impurity providing layer 170R may have a composition, in which in a compound composed of the metal element and oxygen, a thermodynamically stable quantitative relationship between the metal element and oxygen is not formed, but is not limited thereto.

Since the impurity providing layer 170R is a remaining layer after materials are partially diffused into the first layer 164a and the second layer 164b during a manufacturing process, the impurity providing layer 170R may have a thickness less than an initially formed thickness of the impurity providing layer 170R. A thickness T3 of the impurity providing layer 170R may be less than 10 Å, and may be, for example, about 3 Å to about 7 Å. In this case, the doping elements may partially remain in the impurity providing layer 170R so that the impurity providing layer 170R and the first layer 164a and the second layer 164b may have the same elements in kind. If the thickness of the impurity providing layer 170R is relatively great, since an electrical path of charges may be formed along the impurity providing layer 170R, the impurity providing layer 170R may be formed to have a relatively reduced thickness.

Referring to FIG. 6B, a gate dielectric layer 160d may includes a tunneling layer 162, a charge storage layer 164, and a blocking layer 166. An impurity providing layer 170R may be disposed between the tunneling layer 162 and the charge storage layer 164. The impurity providing layer 170R may be disposed on an inner circumferential surface of the charge storage layer 164, and doping elements may be diffused from the impurity providing layer 170R toward the charge storage layer 164 such that the charge storage layer 164 may be doped with the doping elements. Thus, concentration of the doping elements in the charge storage layer 164 may be highest in a region in contact with the impurity providing layer 170R, and may have the same as or similar distribution to that in the case of FIG. 4B.

Referring to FIG. 6C, a gate dielectric layer 160e may include a tunneling layer 162, a charge storage layer 164, and a blocking layer 166. An impurity providing layer 170R may be disposed between the charge storage layer 164 and the blocking layer 166. The impurity providing layer 170R may be disposed on an outer circumferential surface of the charge storage layer 164. For example, the impurity providing layer 170R may be disposed on a side thereof adjacent to the blocking layer 166, in a manner different from the example embodiment of FIG. 6B. Thus, a concentration of the doping elements in the charge storage layer 164 may be highest in a region in contact with the impurity providing layer 170R, and may have the same as or similar distribution to the case of FIG. 4C.

FIGS. 7A to 7I are drawings schematically illustrating main operations in a method of manufacturing a semiconductor device according to example embodiments. In FIGS. 7A to 7I, a region corresponding to an x-z cross section in the perspective view of FIG. 1 will be illustrated.

Figure 7A:
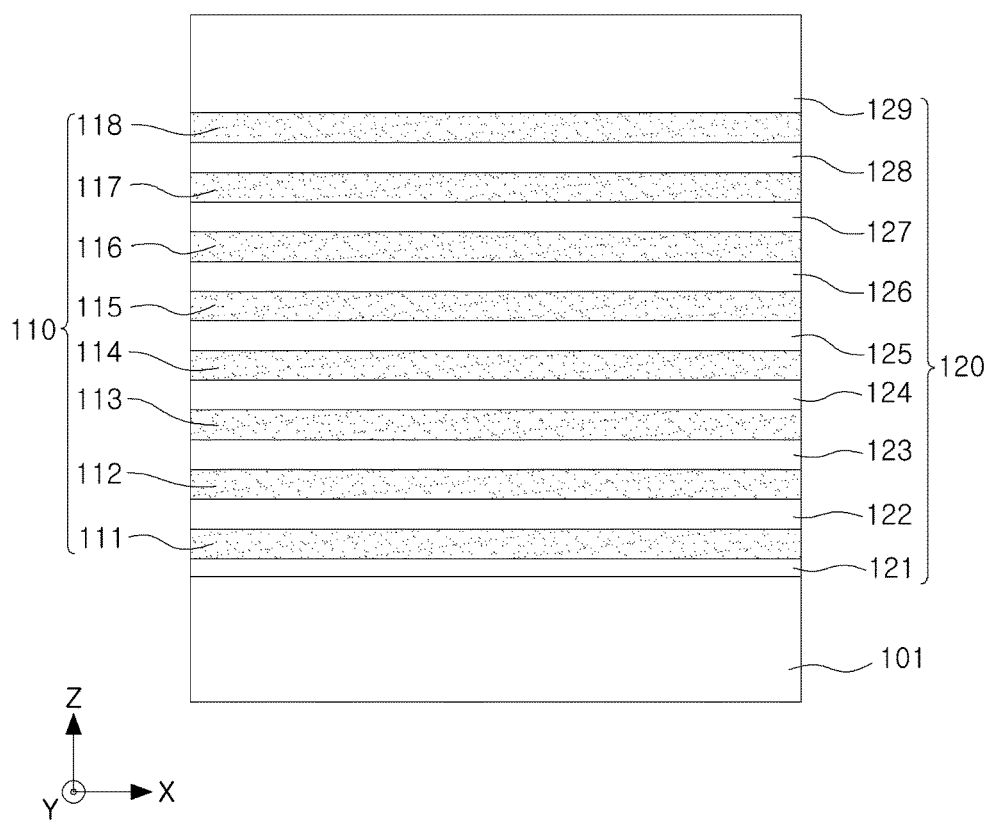
FIGS. 7A to 7I are drawings schematically illustrating main operations in a method of manufacturing a semiconductor device according to example embodiments.

With reference to FIG. 7A, a plurality of sacrificial layers 110 and a plurality of interlayer insulating layers 120) may be alternately stacked on a substrate 101.

The sacrificial layers 110 may be layers replaced with a plurality of gate electrodes through a subsequent process. The sacrificial layers 110 may be formed of a material that may be etched with etch selectivity with respect to the interlayer insulating layers 120. For example, the interlayer insulating layers 120 may be formed of at least one of silicon oxide and silicon nitride, and the sacrificial layers 110 may be formed of a material including silicon, silicon oxide, silicon carbide or silicon nitride, and which is different from a material of the interlayer insulating layers 120. In example embodiments, thicknesses of the interlayer insulating layers 120 need not be all the same. For example, a lowermost interlayer insulating layer 121 may be formed to have a relatively reduced thickness, and an uppermost interlayer insulating layer 129 may be formed to have a relatively increased thickness. Thicknesses of, and the number of layers constituting, the interlayer insulating layers 120 and the sacrificial layers 110, may be variously modified from those illustrated in the drawings.

Figure 7B:
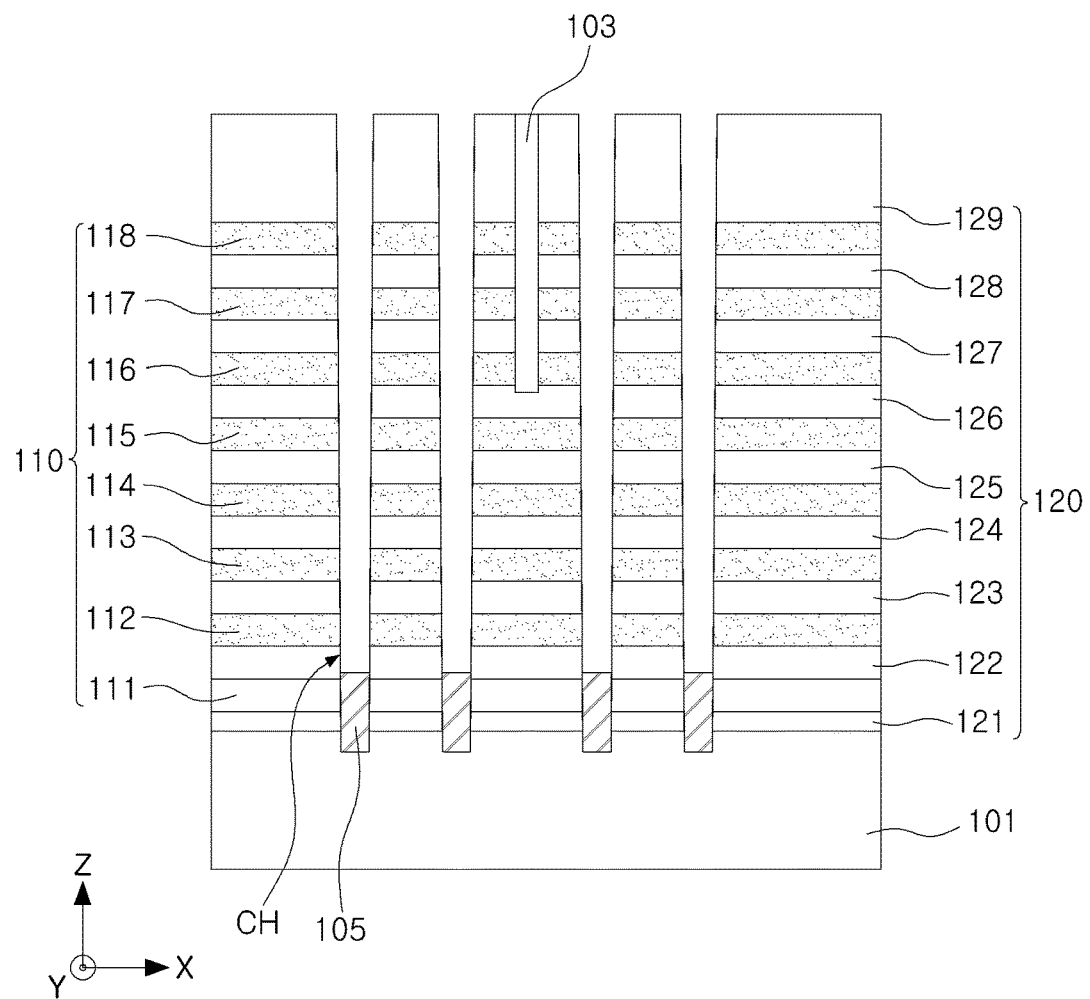

Referring to FIG. 7B, a string insulating layer 103 may be formed, and a plurality of channels CH extending to the substrate 101 in a vertical direction may be formed.

The string insulating layer 103 may be formed by removing a predetermined number of sacrificial layers from the sacrificial layers 110 and the interlayer insulating layers 120 from a top thereof, using a separate mask layer. The string insulating layer 103 may be formed by depositing an insulating material in a region formed by removing the sacrificial layers 110 and the interlayer insulating layers 120. The string insulating layer 103 may be formed of a material having etch selectivity with respect to the sacrificial layers 110, and for example, may be formed of the same material as those of the interlayer insulating layers 120.

The channels CH may be formed by anisotropically etching the sacrificial layers 110 and the interlayer insulating layers 120, and may be formed in a hole shape. Due to a height of the stack structure as described above, sidewalls of the channels CH need not be perpendicular to an upper surface of the substrate 101. In example embodiments, the channels CH may be formed in such a manner that portions of the substrate 101 are recessed by the formation of the channels. Subsequently, in the channels CH, a plurality of epitaxial layers 105 may be formed. The epitaxial layers 105 may be formed using a selective epitaxial growth (SEG) process. The epitaxial layers 105 may be formed of a single layer or a plurality of layers, and may include polycrystalline silicon, single crystalline silicon, polycrystalline germanium, or single crystalline germanium, doped or undoped with impurities.

Next, referring to FIGS. 7C to 7H, a plurality of gate dielectric layers 160, as shown in FIG. 1, may be formed in the channels CH. FIG. 8 is a flow chart illustrating portions of operations in a method of manufacturing a semiconductor device according to example embodiments, which will hereinafter be described together with FIGS. 7C to 7H.

Figure 7C:
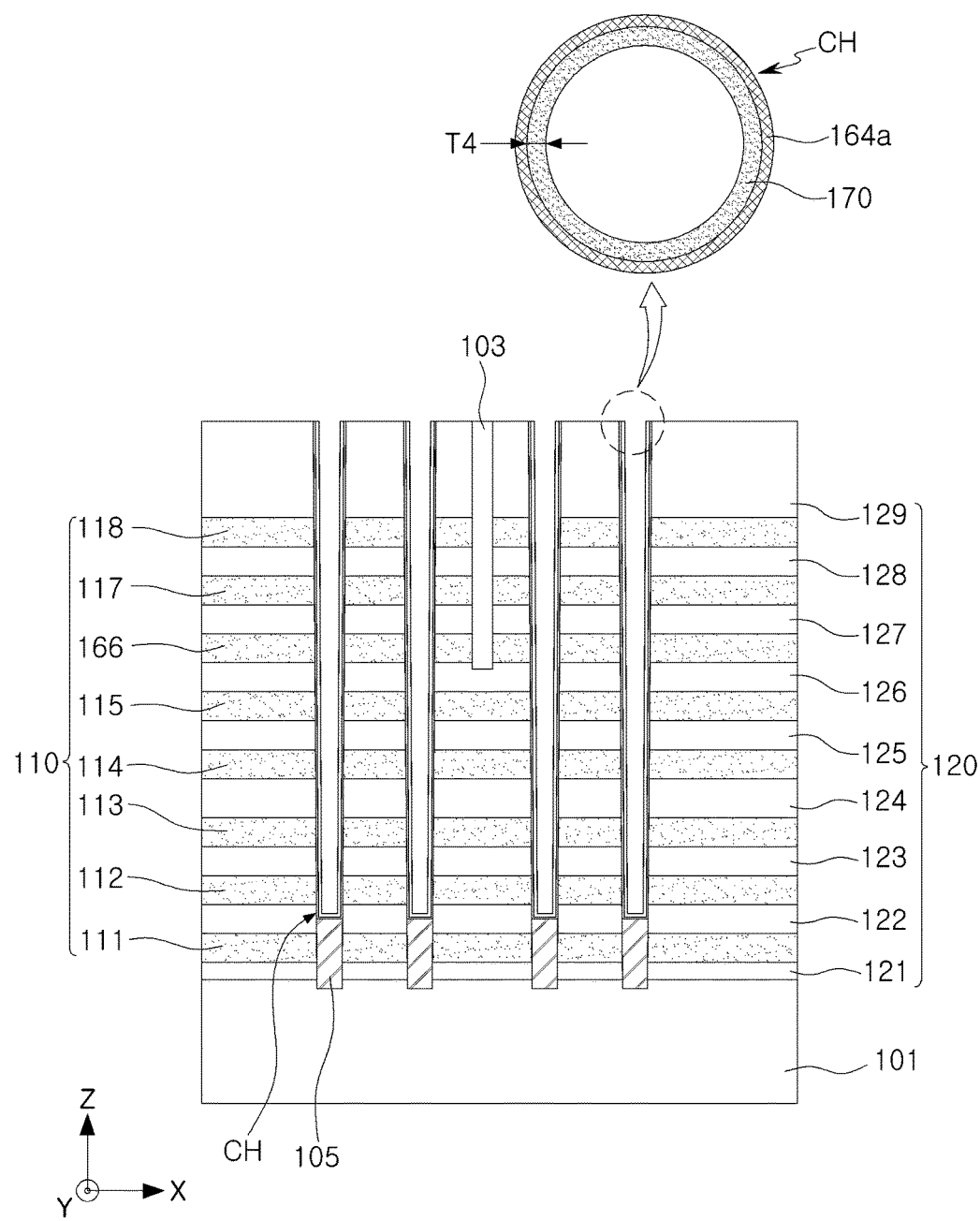
Figure 8:
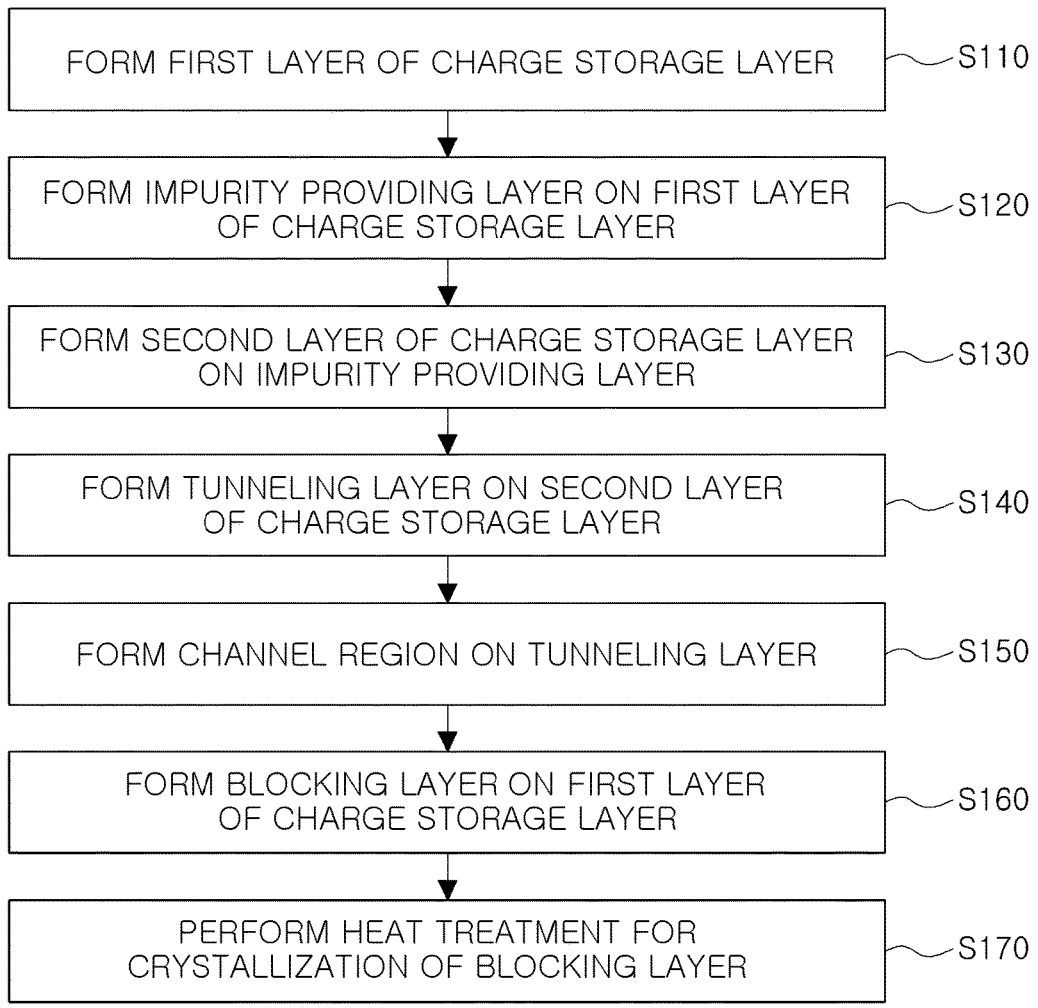
FIG. 8 is a flow chart illustrating portions of operations in a method of manufacturing a semiconductor device according to example embodiments.

With reference to FIGS. 7C and 8, a first layer 164a of a charge storage layer 164 (see FIG. 1) may be formed in the channels CH in S110, and an impurity providing layer 170 may be provided on the first layer 164a in S120.

The first layer 164a of the charge storage layer 164 and the impurity providing layer 170 may be formed using an atomic layer deposition (ALD) process or a chemical vapor deposition (CVD) process. The first layer 164a and the impurity providing layer 170 may also be formed on a top surface of the uppermost interlayer insulating layer 129, but may be omitted.

The first layer 164a may be formed to have a thickness half or less of the thickness of the charge storage layer 164 of FIG. 1. The impurity providing layer 170 is a layer to provide doping elements of at least one of carbon (C), boron (B), lanthanum (La), hafnium (Hf), zirconium (Zr), aluminum (Al) and yttrium (Y) to the charge storage layer 164, and for example, may be at least one layer including at least one of SiCN, SiBN, LaO, HfO, ZrO, AlO, or YO. A material forming the impurity providing layer 170 may diffuse into the charge storage layer 164 in a subsequent process, such that the impurity providing layer 170 need not eventually remain or be reduced in thickness. Thus, in this operation, a thickness T4 of the impurity providing layer 170 may be greater than a thickness of a final structure, for example, the thickness T3 of the impurity providing layer 170R in the example embodiment of FIG. 6A.

In the case in which a portion of the blocking layer 166 (see FIG. 1) extends perpendicularly to an upper surface of the substrate 101 along the channel CH in example embodiments, the portion of the blocking layer 166 may first be formed before the first layer 164a is formed in the operation S110. For example, in the example embodiment described above with reference to FIGS. 2A and 2B, the first blocking layer 166a and the blocking layer 166c may be formed prior to the formation of the first layer 164a in the operation S110.

Figure 7D:
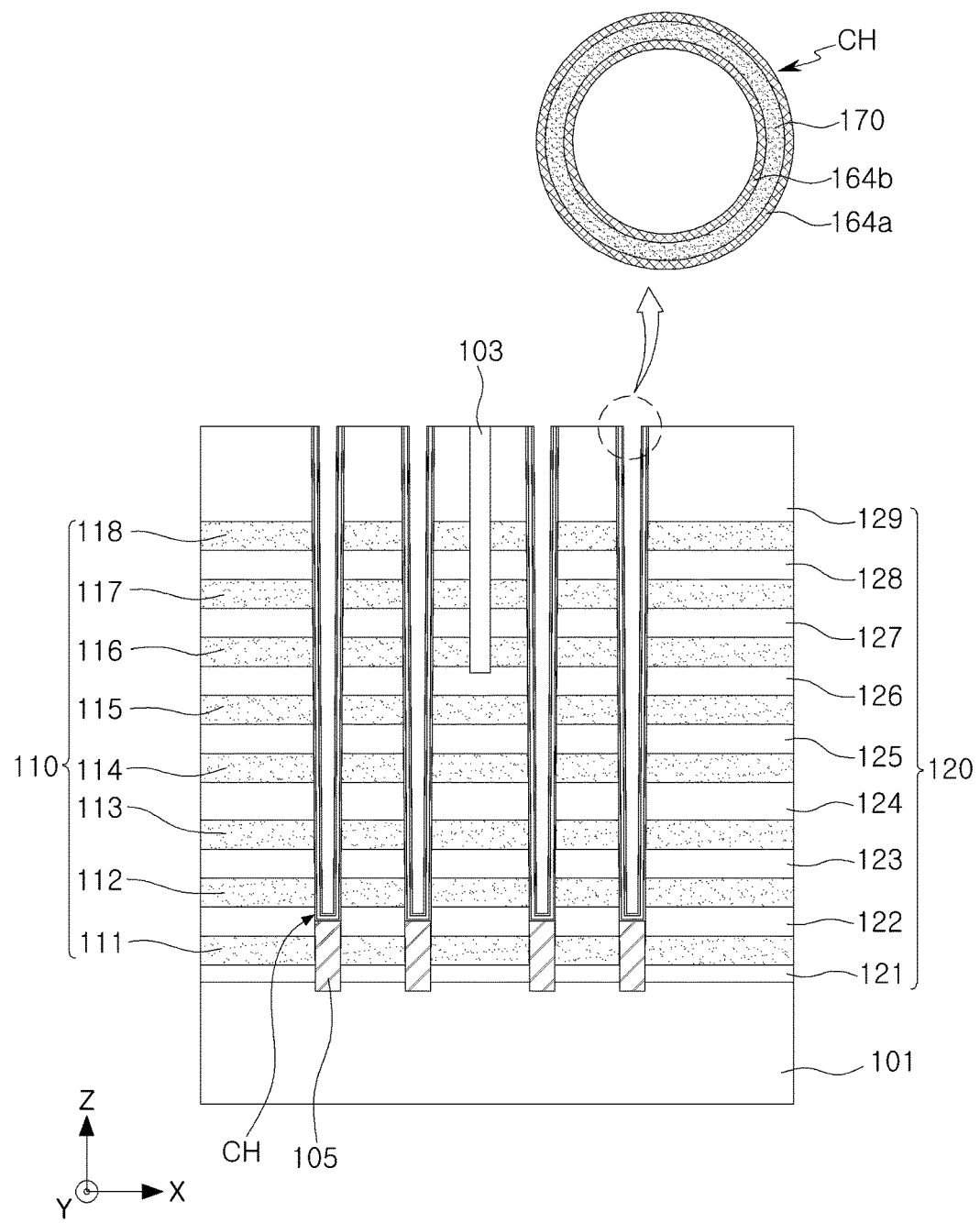

Referring to FIGS. 7D and 8, a second layer 164b of the charge storage layer 164 may be formed on the impurity providing layer 170 in S130. Thus, the impurity providing layer 170 may be provided between the first layer 164a and the second layer 164b of the charge storage layer 164.

The second layer 164b may be formed using an ALD process or a CVD process. The second layer 164b may form the charge storage layer 164, together with the first layer 164a, and thus, may be formed to have a thickness equal to half or less of the thickness of the charge storage layer 164.

Figure 7E:
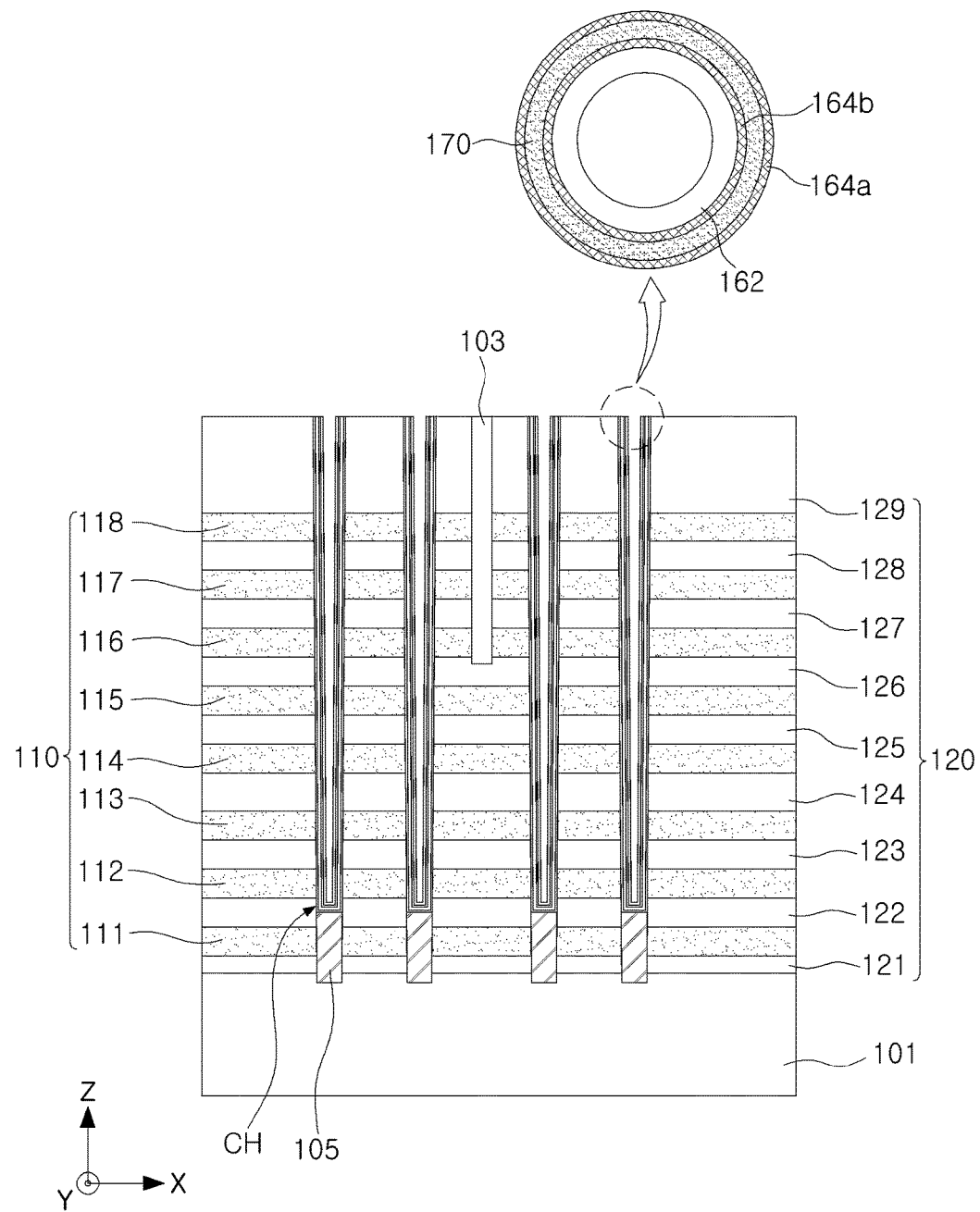

Referring to FIGS. 7E and 8, a tunneling layer 162 may be formed on the second layer 164b of the charge storage layer 164 in S140.

The tunneling layer 162 may be formed using an ALD process or a CVD process. A thickness of the tunneling layer 162 may be equal to or less than a sum of thicknesses of the first layer 164a and the second layer 164b of the charge storage layer 164, but is not limited thereto.

Figure 7F:
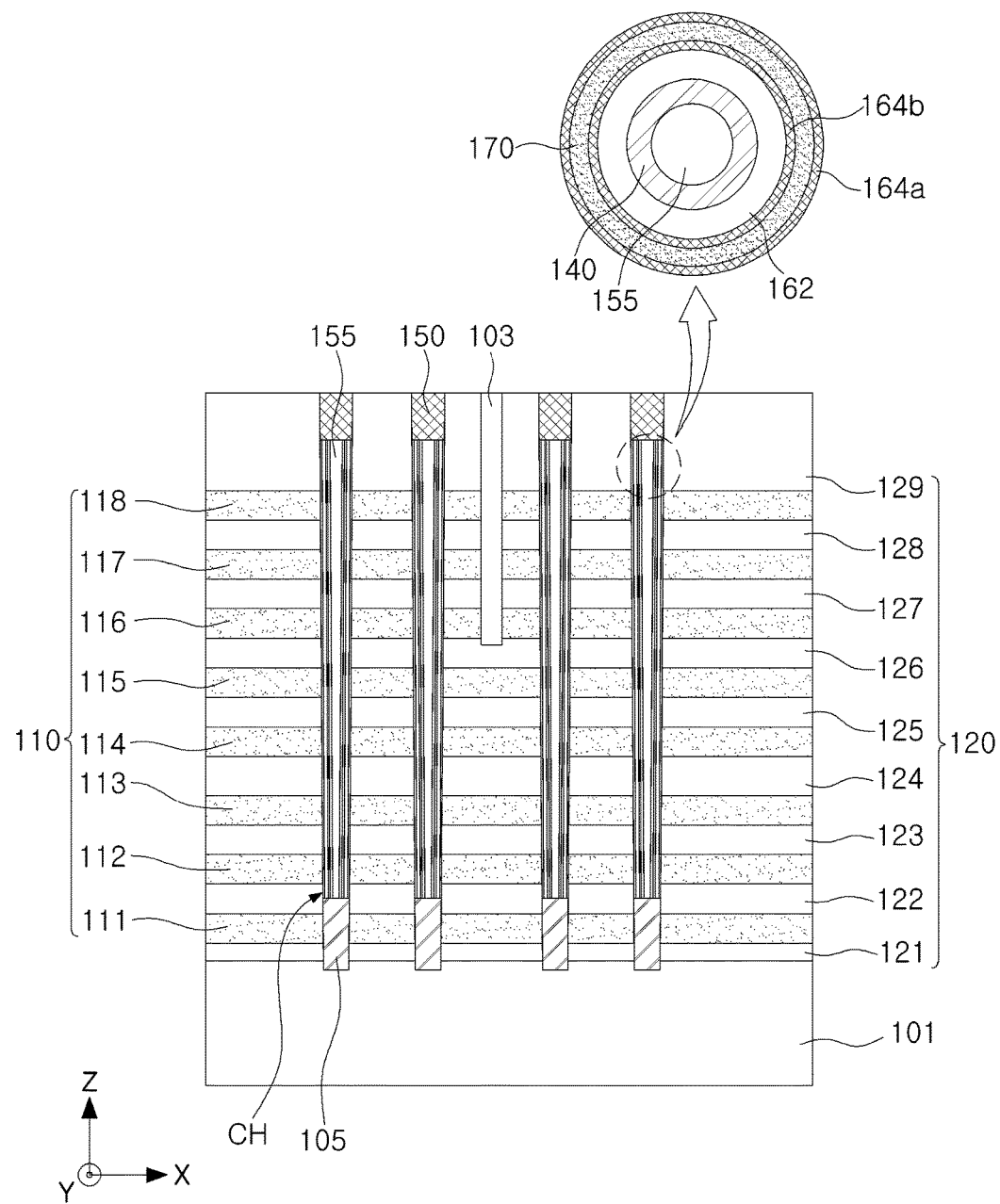

Referring to FIGS. 7F and 8, a channel region 140 may be formed on the tunneling layer 162 in S150. A plurality of channel insulating layers 155 may also be formed in the channels CH. A plurality of channel pads 150 may be formed on the plurality of channel insulating layers 155.

The channel region 140 may be formed to be in contact with the tunneling layer 162. The channel insulating layers 155 may be formed to fill the channels CH, and may be formed of an insulating material, but according to example embodiments, a conductive material rather than the channel insulating layer 155 may also fill between the channel regions 140. The channel pads 150 may be formed of a conductive material. Each of the channel pads 150 may be electrically connected to the channel region 140, and may electrically connect the channel region 140 to a bit line to be formed on each of the channel pads 150.

Figure 7G:
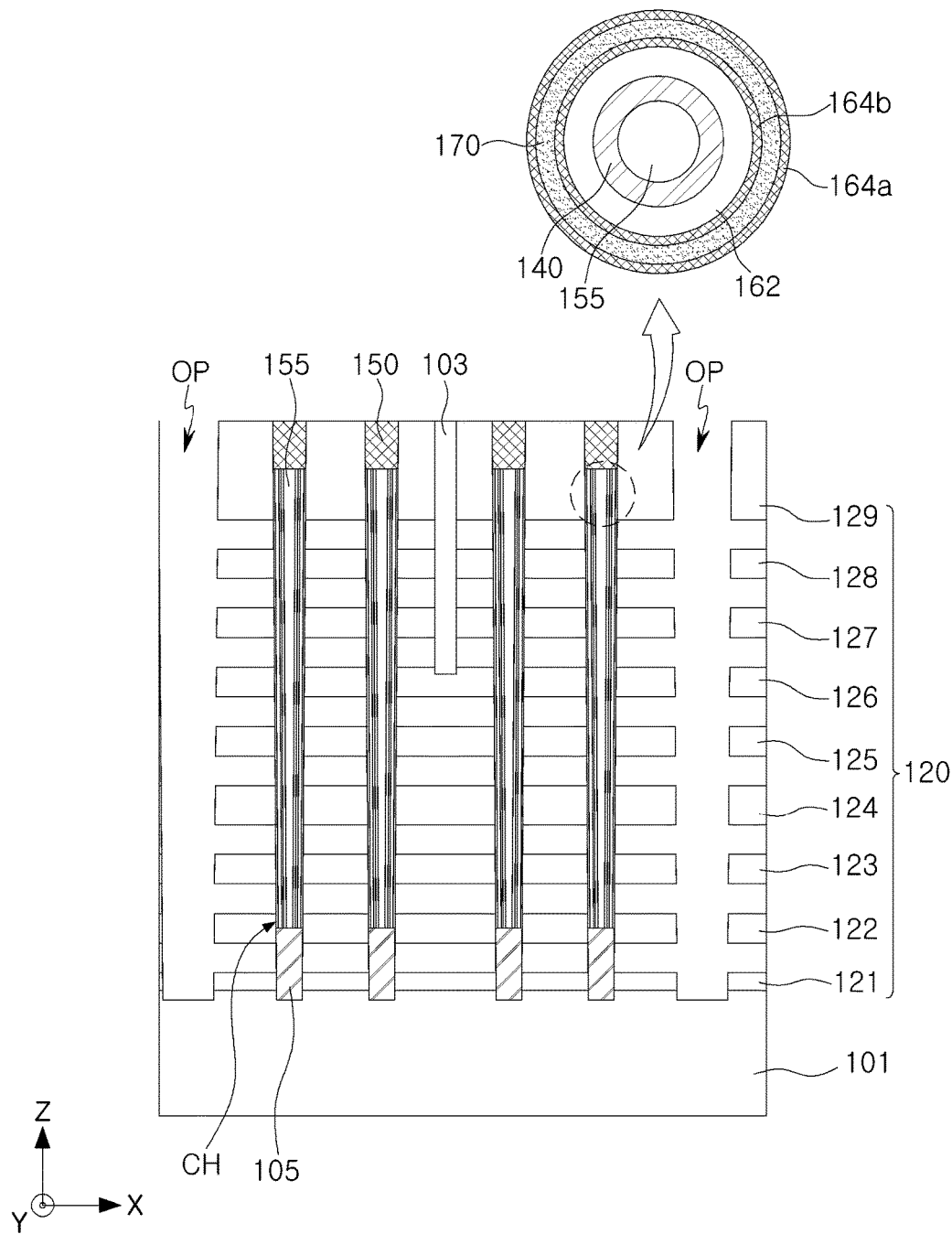

Referring to FIG. 7G, openings OP dividing a stack of the sacrificial layers 110 and the interlayer insulating layers 120 into portions by a predetermined interval therebetween may be formed, and the sacrificial layers 110 exposed through the openings OP may be removed.

Further, before the openings OP are formed, an insulating layer may also be additionally formed on an uppermost interlayer insulating layer 129 and the channel pads 150, to prevent damage to the channel pads 150, the channel region 140 below each of the channel pads 150, and the like. The openings OP may be formed by forming a mask layer using a photolithography process and anisotropically etching a stack of the sacrificial layers 110 and the interlayer insulating layers 120. The openings OP may be formed in the form of a trench extending in a Y direction. The sacrificial layers 110 may be selectively removed with respect to the interlayer insulating layers 120 using, for example, a wet etching process. Thus, a plurality of side openings may be formed between the interlayer insulating layers 120, and portions of a sidewall of the first layer 164a of the charge storage layer 164, may be exposed.

Figure 7H:
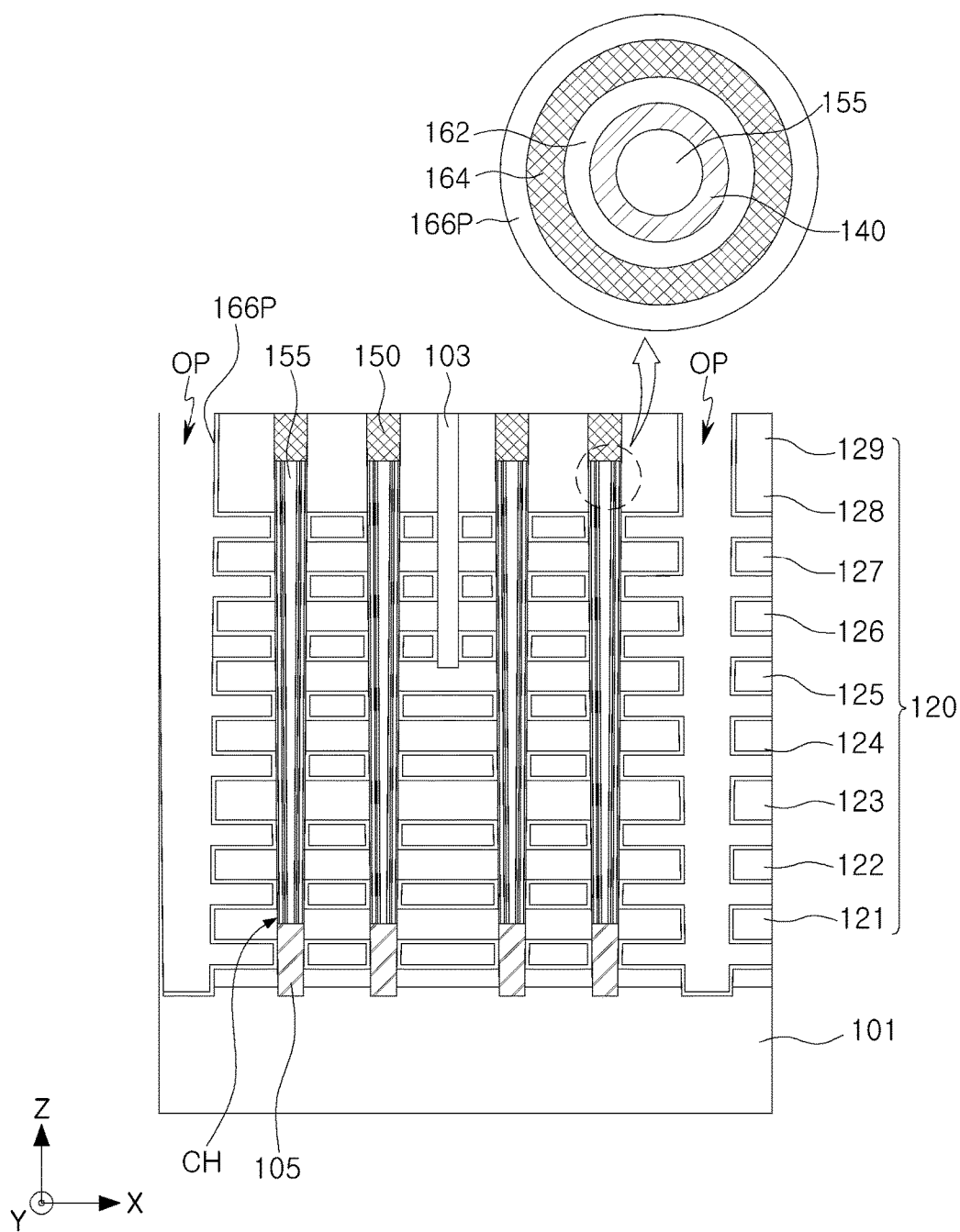

Referring to FIGS. 7H and 8, a preliminary blocking layer 166P may be formed on the first layer 164a exposed through the side openings in S160, and a heat treatment for crystallization of the preliminary blocking layer 166P may be performed in S170.

The preliminary blocking layer 166P may be formed on a surface of the first layer 164a exposed outside of the channel CH and may be formed using an ALD process or a CVD process. The preliminary blocking layer 166P may be formed of a high-k dielectric material, and a heat treatment process for crystallization of the preliminary blocking layer 166P may be performed. The heat treatment process may be performed at a temperature ranging, for example, from 600° C. to 1100° C. Doping elements included in the impurity providing layer 170 may be diffused into the first layer 164a and the second layer 164b of the charge storage layer 164, adjacent thereto, by the heat treatment process, but the diffusion of the doping elements is not limited to this operation. The diffusion of doping elements may also be performed by performing a separate heat treatment for diffusion according to example embodiments. Alternatively, at least a portion of doping materials may also be diffused in high-temperature process operations before or after the operation S170.

In the case of the example embodiment, after the heat treatment process, doping elements of the impurity providing layer 170 may be diffused into the charge storage layer 164, and thus, need not remain as a separate layer which can be separated from the charge storage layer 164. Thus, as the first layer 164a and the second layer 164b are connected to each other as one layer, the charge storage layer 164 may form a single layer. In this case, the charge storage layer 164 may have an increased thickness to be greater than a thickness of a sum of thicknesses of the first layer 164a and the second layer 164b due to the impurity providing layer 170, but the thickness of the charge storage layer 164 is not limited thereto. The case of the example embodiment described above with reference to FIG. 6A may correspond to the case in which a portion of the impurity providing layer 170 remains, even after the heat treatment process.

Figure 7I:
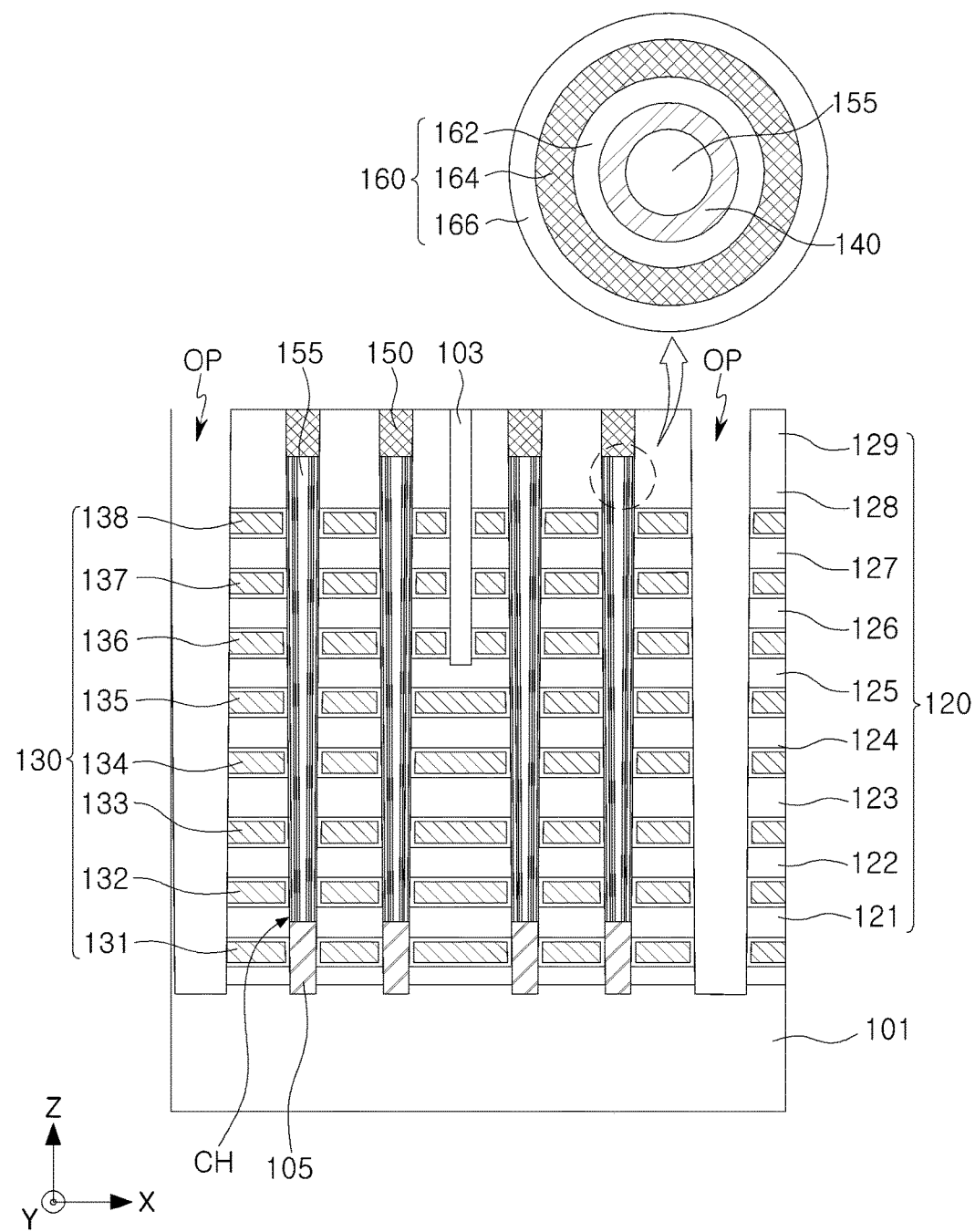

Referring to FIG. 7I, a plurality of gate electrodes 130 may be formed in the side openings.

The gate electrodes 130 may include a metal, polycrystalline silicon, or a metal silicide material. After a preliminary gate electrode is formed, a material forming the preliminary gate electrode and the preliminary blocking layer 166P formed in the opening OP may be removed through an additional process, in such a manner that the gate electrodes 130 may only be disposed in the side openings. In example embodiments, a structure, in which the interlayer insulating layers 120 protrude further than the gate electrodes 130 toward the openings OP, may be formed.

Next, referring to FIG. 1 together, a source insulating layer 180 and a source conductive layer 185 may be formed in the opening OP. The source insulating layer 180 may be formed in the form of a spacer by forming an insulating material and removing the insulating material on the substrate 101 to expose an upper surface of the substrate 101. The source conductive layer 185 may be formed by depositing a conductive material between the source insulating layers 180. Subsequently, wiring structures, such as contact plugs and bit lines, may further be formed on the channel pads 150.

Figure 9A:
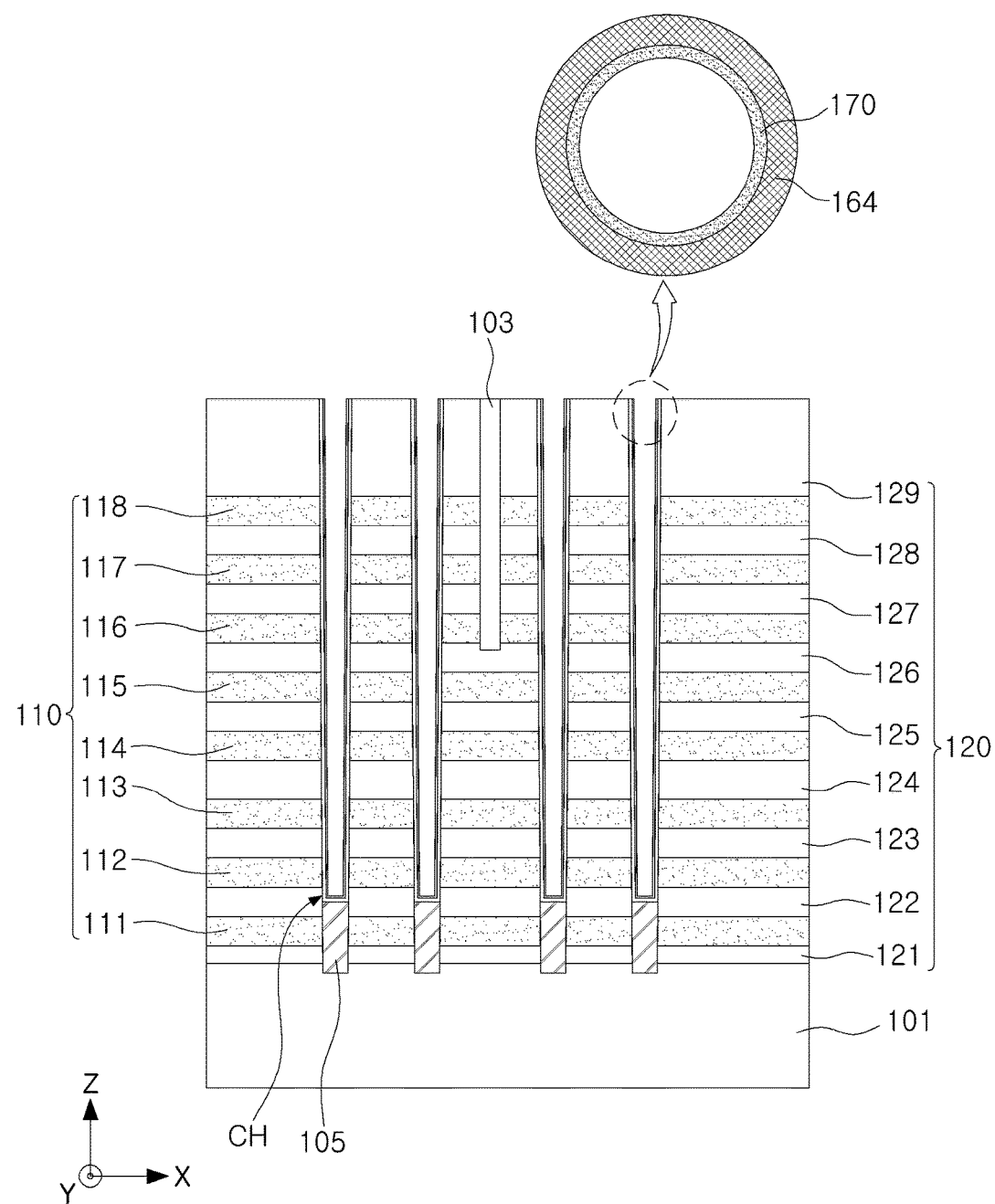
FIGS. 9A and 9B are cross-sectional views schematically illustrating portions of operations in a method of manufacturing a semiconductor device according to example embodiments.
Figure 9B:
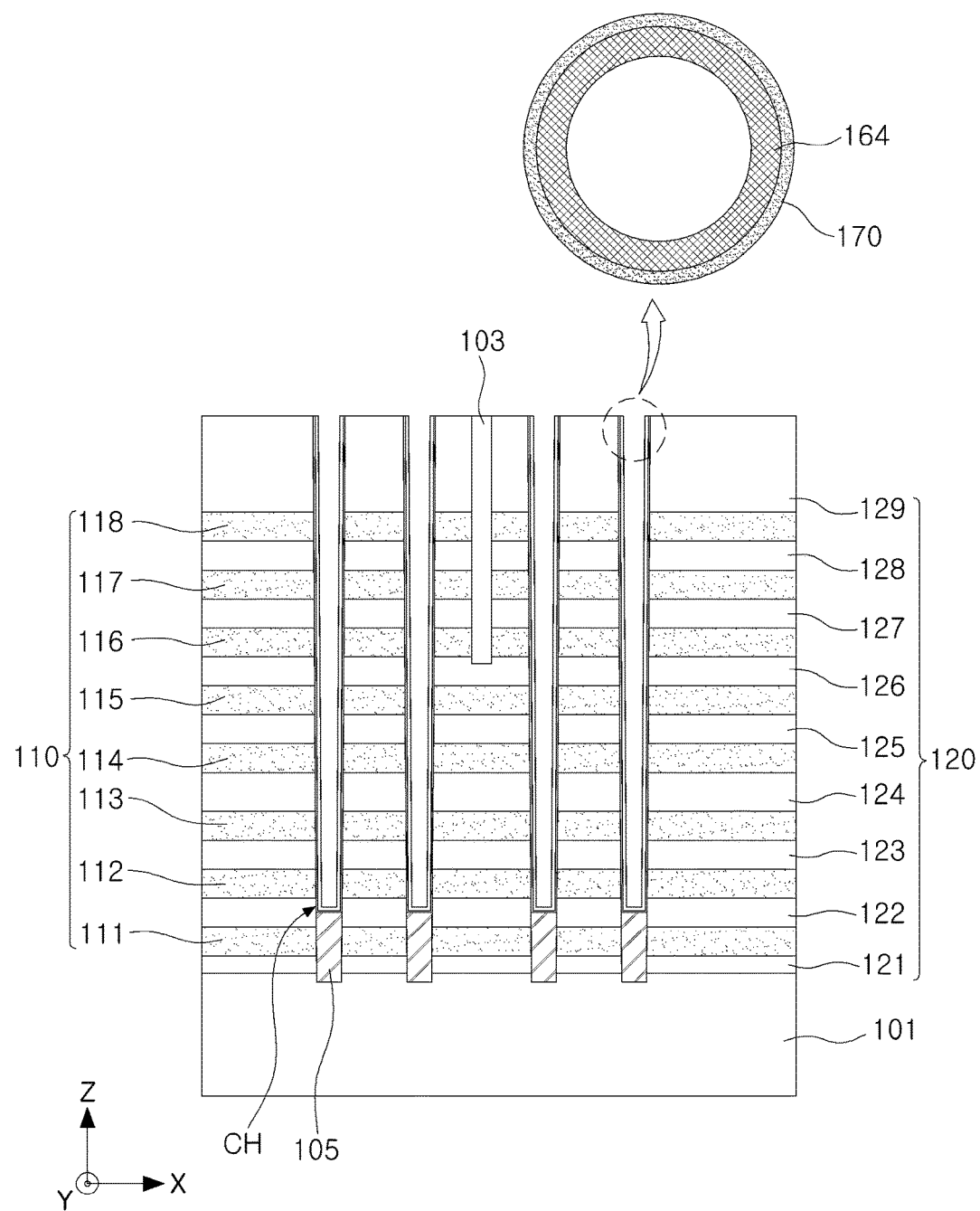

FIGS. 9A and 9B are cross-sectional views schematically illustrating portions of operations in a method of manufacturing a semiconductor device according to example embodiments.

Referring to FIG. 9A, a charge storage layer 164 may be formed in each of a plurality of channels CH, and an impurity providing layer 170 may be formed on the charge storage layer 164.

In the example embodiment, in a manner different from the example embodiment described above with reference to FIG. 7C, the entirety of the charge storage layers 164, other than a portion thereof, may be formed, and the impurity providing layer 170 may be formed on the charge storage layer 164. Then, a tunneling layer 162 may be formed on the impurity providing layer 170, and processes the same as the processes described above with reference to FIGS. 7E to 7I may be performed. According to the method of manufacturing a semiconductor device according to the example embodiment, the charge storage layer 164 may have a concentration distribution of doping elements, similar to that of the doping elements illustrated in FIG. 4B. Further, in the case in which the impurity providing layer 170 remains during the heat treatment process described above with reference to FIG. 7H, a structure similar to that of the example embodiment of FIG. 6B may be provided.

Referring to FIG. 9B, an impurity providing layer 170 may be formed in a plurality of channels CH, and a charge storage layer 164 may be formed on the impurity providing layer 170.

In the example embodiment, in a manner different from the example embodiment described above with reference to FIG. 7C, the impurity providing layer 170 may first be formed in the channels CH, and then, the charge storage layer 164 may be formed. Subsequently, a tunneling layer 162 may be formed on the charge storage layer 164, and processes the same as the processes described above with reference to FIGS. 7E to 7I may be performed in the same manner. According to the method of manufacturing a semiconductor device in the example embodiment, the charge storage layer 164 may have a concentration distribution of doping elements, similar to that of the doping elements illustrated in FIG. 4C. Further, in the case in which the impurity providing layer 170 remains during the heat treatment process described above with reference to FIG. 7H, a structure similar to that of the example embodiment of FIG. 6C may be provided.

Figure 10:
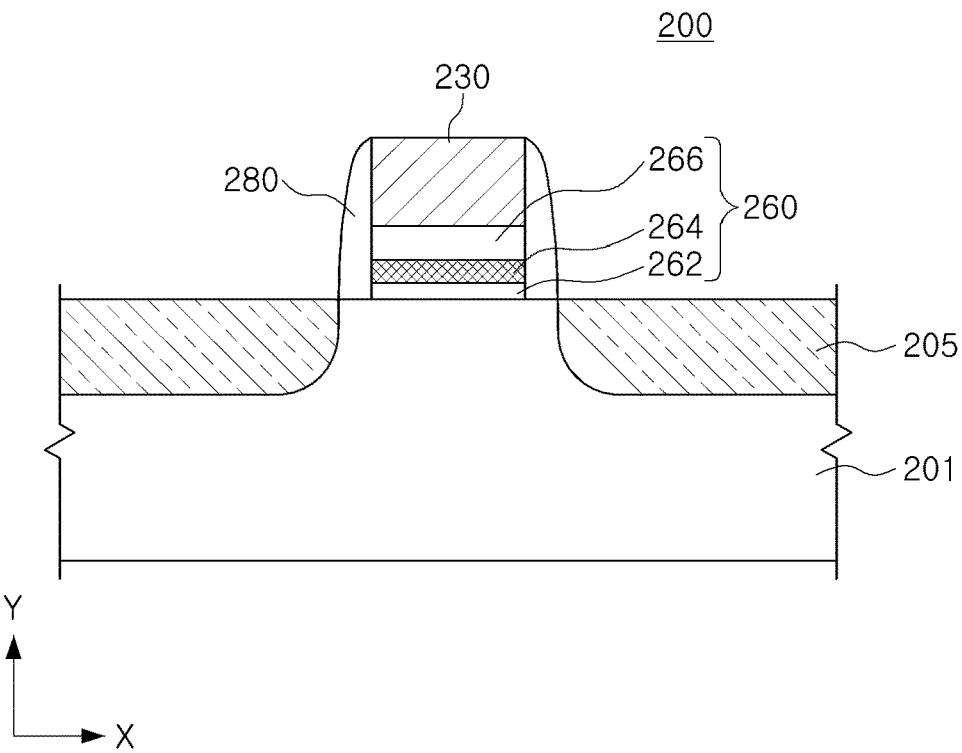
FIG. 10 is a schematic cross-sectional view of a semiconductor device according to example embodiments.

FIG. 10 is a schematic cross-sectional view of a semiconductor device according to example embodiments.

Figure 11:
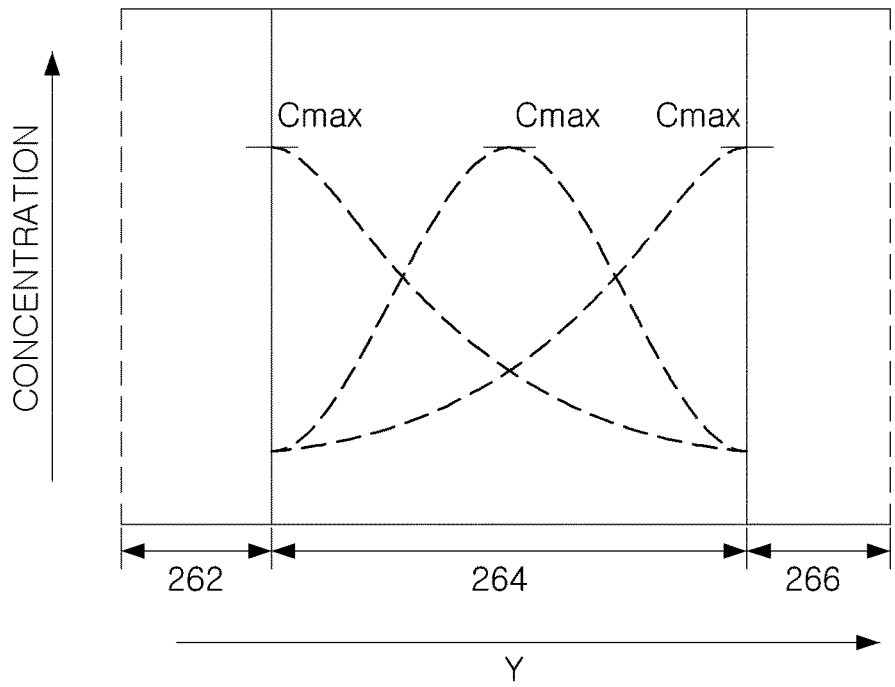
FIG. 11 is a graph illustrating a concentration distribution of doping elements in a charge storage layer according to example embodiments.

FIG. 11 provides graphs illustrating a concentration distribution of doping elements in a charge storage layer according to example embodiments.

With reference to FIG. 10, a semiconductor device 200 may include a substrate 201, source/drain regions 205 in the substrate 201, a gate dielectric layer 260 on the substrate, and a gate electrode 230 on the gate dielectric layer 260. The semiconductor device 200 may further include a spacer layer 280 disposed on sidewalls of the gate dielectric layer 260 and the gate electrode 230. The semiconductor device 200 may be a top gate-type thin film transistor, or may be a charge trap-type transistor. In example embodiments, a plurality of memory cells having the same structure as the semiconductor device 200 may be arranged on the substrate 201, to form a memory cell string.

The substrate 201 may include a semiconductor material, for example, a group IV semiconductor material, a group III-V compound semiconductor material, or a group II-VI oxide semiconductor material. The source/drain regions 205 may be located within the substrate 201 on two sides of the gate dielectric layer 260 and the gate electrode 230. The source/drain regions 205 may include p-type impurities or n-type impurities. The gate electrode 230 may include a metal, polycrystalline silicon, or a metal silicide material. The spacer layer 280 may be disposed for isolation and protection, and may include a silicon nitride or a silicon oxide.

The gate dielectric layer 260 may be disposed between the gate electrode 230 and the substrate 201. The gate dielectric layer 260 may include a tunneling layer 262, a charge storage layer 264, and a blocking layer 266 sequentially stacked from the substrate 201. Each of the tunneling layer 262, the charge storage layer 264 and the blocking layer 266, constituting the gate dielectric layer 260, may be comprised of a single layer or a plurality of layers.

The tunneling layer 262 may allow for tunneling of a charge to be transmitted to the charge storage layer 264 via F—N tunneling mechanism. The tunneling layer 262 may include, for example, silicon oxide. The blocking layer 266 may include a high-k dielectric material. The charge storage layer 264 may be a charge trap layer formed of silicon nitride. The charge storage layer 264 may include doping elements forming deep-level traps. The doping elements may be at least one of C, B, La, Hf, Zr, Al and Y, and may be non-uniformly distributed in the charge storage layer 264 in a thickness direction of the charge storage layer 264.

Referring to FIG. 11, a position in which the doping elements has a maximum concentration Cmax in the charge storage layer 264 may be changed according to example embodiments, and thus, a concentration distribution thereof may also be changed. The position having the maximum concentration Cmax of the doping elements may be a center portion of the charge storage layer 264 or may be one edge of the charge storage layer 264, in a Y direction. For example, when the maximum concentration Cmax is provided in the center portion of the charge storage layer 264, the concentration of the doping elements may decrease toward both edges of the charge storage layer from the center portion thereof. The center portion of the charge storage layer 264 may correspond to a region of a point at which a thickness corresponds to about half of a thickness of the charge storage layer 264, but is not limited thereto. In the case in which the maximum concentration Cmax is positioned at one edge of the charge storage layer 264, the concentration of the doping elements may decrease toward the other edge thereof in the Y direction. In this case, the concentration of the doping elements in the charge storage layer 264 may have a maximum concentration Cmax in a region adjacent to the tunneling layer 262, or may have a maximum concentration Cmax in a region adjacent to the blocking layer 266.

Figure 12:
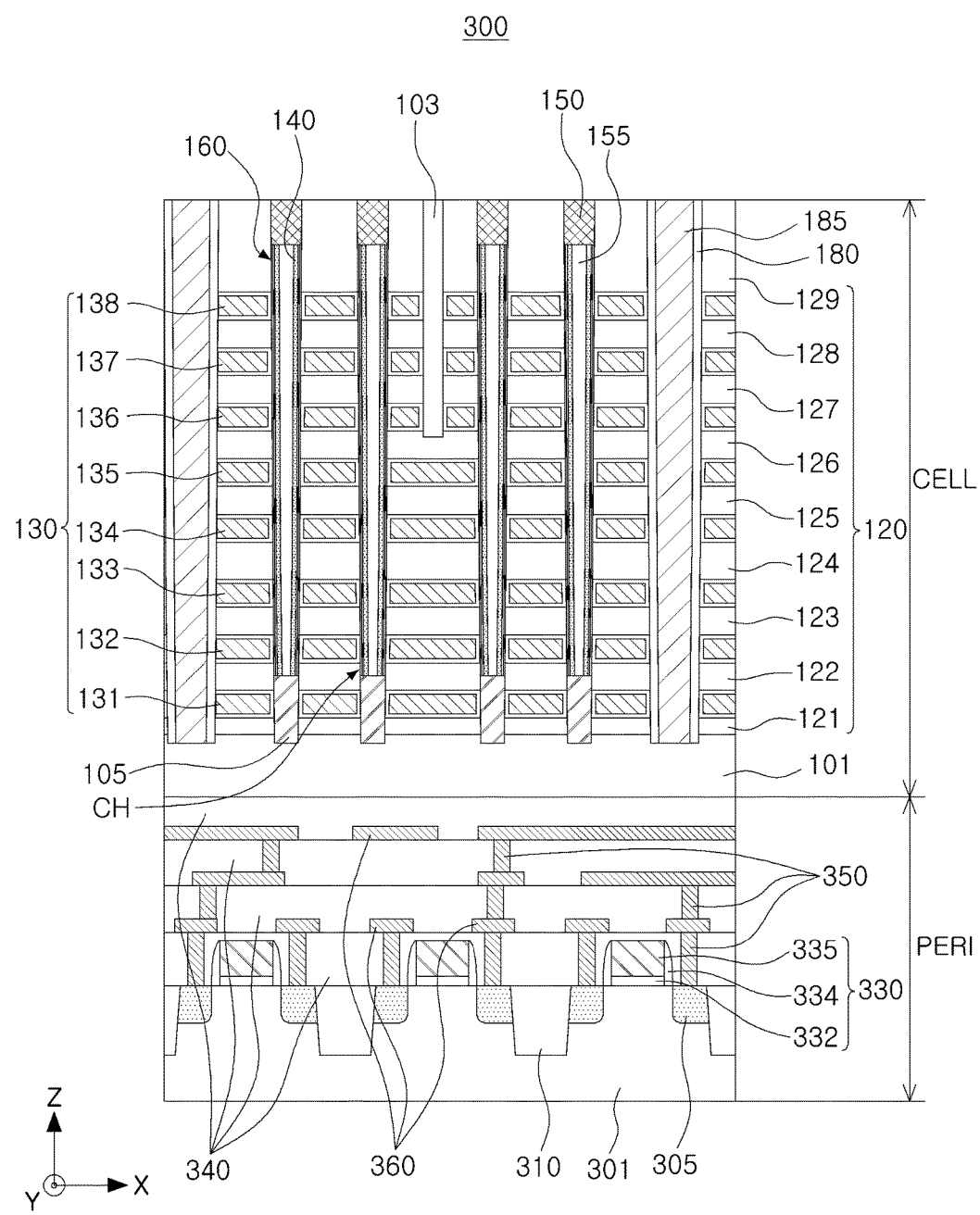
FIG. 12 is a schematic cross-sectional view of a semiconductor device according to example embodiments.

FIG. 12 is a schematic cross-sectional view of a semiconductor device according to example embodiments.

Referring to FIG. 12, a semiconductor device 300 may include a memory cell region CELL and a peripheral circuit region PERI. The memory cell region CELL may be disposed on an upper end of the peripheral circuit region PERI. In example embodiments, the memory cell region CELL may also be disposed on a lower end of the peripheral circuit region PERI.

The memory cell region CELL may include a substrate 101, a plurality of gate electrodes 130 stacked on the substrate 101, a plurality of channels CH arranged to penetrate through the gate electrodes 130, and a gate dielectric layer 160. The gate dielectric layer 160 may include a charge storage layer 164 (see FIG. 1) including doping elements, and the doping elements may be at least one of C, B, La, Hf, Zr, Al and Y. In the example embodiment, the memory cell region CELL is illustrated as having the same structure as the example embodiment of FIG. 1, but is not limited thereto. Thus, the memory cell region CELL may have a structure according to various example embodiments.

The peripheral circuit region PERI may include a base substrate 301, a plurality of circuit elements 330 disposed on the base substrate 301, a plurality of contact plugs 350, and a plurality of wiring lines 360.

The base substrate 301 may have an upper surface extended in X and Y directions. In the base substrate 301, a plurality of device isolation layers 310 may be formed to define a plurality of active regions. Each of a plurality of source/drain regions 305 including impurities may be disposed in a portion of the active regions. The base substrate 301 may include a semiconductor material, for example, a group IV semiconductor material, a group III-V compound semiconductor material, or a group II-VI oxide semiconductor material.

The circuit elements 330 may include a planar transistor. Each of the circuit elements 330 may include a circuit gate insulating layer 332, a spacer layer 334, and a circuit gate electrode 335. The source/drain regions 305 may be disposed in the base substrate 301 on both sides of the circuit gate electrode 335 to serve as a source region or a drain region of the circuit element 330.

A plurality of peripheral-region insulating layers 340 may be disposed on the circuit elements 330, above the base substrate 301. The contact plugs 350 may penetrate through the peripheral-region insulating layers 340 to be connected to the source/drain regions 305. An electrical signal may be applied to the circuit elements 330 via the contact plugs 350. The contact plugs 350 may also be connected to the circuit gate electrodes 335 in a region not illustrated in the drawing. The wiring lines 360 may be connected to the contact plugs 350, and may be arranged in a plurality of layers.

In the case of the semiconductor device 300, after the peripheral circuit region PERI is first formed, the substrate 101 of the memory cell region CELL may be formed thereon to form the memory cell region CELL. The substrate 101 may have the same size as that of the base substrate 301, or may be formed to have a size smaller than that of the base substrate 301. The memory cell region CELL and the peripheral circuit region PERI may be connected to each other in a region not illustrated in the drawing. For example, one end of the gate electrodes 130 in an X direction may be electrically connected to the circuit elements 330.

As set forth above, according to example embodiments, by forming deep-level traps in a charge storage layer, a semiconductor device having improved reliability may be provided.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
a plurality of gate electrodes stacked on an upper surface of a substrate in a direction perpendicular to an upper surface of the substrate;
a channel region penetrating through the plurality of gate electrodes to extend perpendicularly to the upper surface of the substrate; and
a gate dielectric layer including a tunneling layer, a charge storage layer and a blocking layer that are sequentially disposed between the channel region and the plurality of gate electrodes,
wherein the charge storage layer includes a plurality of doping elements and a plurality of deep level traps generated by the plurality of doping elements,
wherein a concentration distribution of the plurality of doping elements in a thickness direction of the charge storage layer is non-uniform
wherein the charge storage layer includes silicon nitride, and
wherein the concentration distribution of the plurality of doping elements has a maximum concentration of about 2 at. % to about 7 at. % of nitrogen (N) concentration of the charge storage layer.

2. The semiconductor device of claim 1,
wherein the plurality of doping elements include at least one of carbon (C), boron (B), lanthanum (La), hafnium (Hf), zirconium (Zr), aluminum (Al) and yttrium (Y).

3. The semiconductor device of claim 1,
wherein the concentration distribution of the plurality of doping elements has the maximum concentration at a center portion of the charge storage layer in the thickness direction thereof with a concentration decreasing away from the center portion toward both edges of the charge storage layer in the thickness direction.

4. The semiconductor device of claim 1,
wherein the concentration distribution of the plurality of doping elements has a concentration decreasing toward an edge of the charge storage layer in the thickness direction thereof.

5. The semiconductor device of claim 1,
wherein the plurality of doping elements are bonded with nitrogen (N) of the charge storage layer.

6. The semiconductor device of claim 1, further comprising:
an impurity providing layer disposed to be in contact with the charge storage layer and provide the plurality of doping elements to the charge storage layer.

7. The semiconductor device of claim 6,
wherein the impurity providing layer is disposed in the charge storage layer to be located in a center portion of the charge storage layer in the thickness direction.

8. The semiconductor device of claim 6,
wherein the impurity providing layer is disposed on at least one edge of the charge storage layer in the thickness direction.

9. The semiconductor device of claim 6,
wherein the impurity providing layer includes a plurality of elements including at least one of carbon (C), boron (B), lanthanum (La), hafnium (Hf), zirconium (Zr), aluminum (Al) and yttrium (Y), and
wherein the plurality of elements and the plurality of doping elements are the same in kind.

10. The semiconductor device of claim 9,
wherein the impurity providing layer includes at least one of SiCN, SiBN, LaO, HfO, ZrO, AlO and YO.

11. The semiconductor device of claim 10,
wherein the charge storage layer further includes oxygen (O) diffused from the impurity providing layer.

12. The semiconductor device of claim 6,
wherein a thickness of the impurity providing layer is less than about 10 Å.

13. The semiconductor device of claim 1,
wherein the blocking layer includes a first layer and a second layer,
wherein the first layer is disposed to be in contact with the charge storage layer and
wherein the first layer includes a silicon oxide and a second layer includes a high-k dielectric material.

14. A semiconductor device comprising:
a plurality of gate electrodes stacked on a substrate in a direction perpendicular to an upper surface of the substrate;

a channel region penetrating through the plurality of gate electrodes to extend perpendicularly to the upper surface of the substrate;

a gate dielectric layer including a tunneling layer, a charge storage layer and a blocking layer that are sequentially disposed between the channel region and the plurality of gate electrodes; and an impurity providing layer disposed to be in contact with the charge storage layer, wherein the charge storage layer includes a silicon nitride doped with a plurality of doping elements including at least one of C, B, La, Hf, Zr, Al and Y, and wherein the charge storage layer has a concentration distribution of the plurality of doping elements with a maximum concentration in a region of which the charge storage layer is in contact with the impurity providing layer.

15. The semiconductor device of claim 14, wherein the plurality of doping elements are non-uniformly distributed in the charge storage layer in a thickness direction.

16. A semiconductor device comprising:

a gate electrode disposed on a channel region; and a gate dielectric layer including a tunneling layer, a charge storage layer, and a blocking layer that are sequentially disposed between the channel region and the gate electrode, wherein the charge storage layer includes a plurality of doping elements forming a plurality of deep level traps, and the plurality of doping elements are at least one of C, B, La, Hf, Zr, Al and Y, wherein the charge storage layer includes silicon nitride, and wherein a concentration distribution of the plurality of doping elements has a maximum concentration of about 2 at. % to about 7 at. % of nitrogen (N) concentration of the charge storage layer.

17. The semiconductor device of claim 16, wherein the plurality of doping elements are non-uniformly distributed in the charge storage layer in a thickness direction.

* * * * *